United States Patent
Hyuga

(10) Patent No.: US 9,277,619 B2
(45) Date of Patent: Mar. 1, 2016

(54) LIGHT EMITTING LAYER-FORMING SOLID MATERIAL, ORGANIC ELECTROLUMINESCENT DEVICE AND METHOD FOR PRODUCING THE SAME

(75) Inventor: Hiroaki Hyuga, Kanagawa (JP)

(73) Assignee: UDC Ireland, Dublin (IE)

( * ) Notice: Subject to any disclaimer, the term of this patent is extended or adjusted under 35 U.S.C. 154(b) by 600 days.

(21) Appl. No.: 13/045,176

(22) Filed: Mar. 10, 2011

(65) Prior Publication Data

US 2011/0233457 A1 Sep. 29, 2011

(30) Foreign Application Priority Data

Mar. 23, 2010 (JP) .................. 2010-066666

(51) Int. Cl.
| | |
|---|---|
| H01L 51/54 | (2006.01) |
| C09K 11/06 | (2006.01) |
| H05B 33/10 | (2006.01) |
| H01L 51/50 | (2006.01) |
| C09K 11/59 | (2006.01) |

(52) U.S. Cl.
CPC ............... *H05B 33/10* (2013.01); *C09K 11/06* (2013.01); *C09K 11/59* (2013.01); *H01L 51/50* (2013.01)

(58) Field of Classification Search
CPC ........ H05B 33/10; H05B 33/14; H04L 51/50; H04L 51/54; C09K 11/06; C09K 11/59
See application file for complete search history.

(56) References Cited

U.S. PATENT DOCUMENTS

| | | | | |
|---|---|---|---|---|
| 4,707,419 A | * | 11/1987 | Ogura et al. | 428/690 |
| 4,882,517 A | * | 11/1989 | Maruyama et al. | 313/502 |
| 5,670,839 A | * | 9/1997 | Noma et al. | 313/503 |
| 5,683,823 A | | 11/1997 | Shi et al. | |
| 6,835,469 B2 | * | 12/2004 | Kwong et al. | 428/690 |
| 2002/0197511 A1 | * | 12/2002 | D'Andrade et al. | 428/690 |
| 2004/0076853 A1 | * | 4/2004 | Jarikov | 428/690 |
| 2004/0124766 A1 | * | 7/2004 | Nakagawa et al. | 313/504 |
| 2006/0003184 A1 | * | 1/2006 | Hatwar et al. | 428/690 |
| 2006/0088729 A1 | * | 4/2006 | Begley et al. | 428/690 |
| 2006/0105198 A1 | * | 5/2006 | Spindler et al. | 428/690 |
| 2006/0269782 A1 | * | 11/2006 | Liao et al. | 428/690 |
| 2007/0015006 A1 | * | 1/2007 | Lee et al. | 428/690 |
| 2009/0121624 A1 | * | 5/2009 | D'Andrade et al. | 313/504 |

FOREIGN PATENT DOCUMENTS

| | | |
|---|---|---|
| JP | 09-95620 | 8/1997 |
| JP | 2001323367 | 11/2001 |
| JP | 2003-249359 A | 9/2003 |
| JP | 2003249359 | 9/2003 |
| JP | 2004-228088 A | 8/2004 |
| JP | 2007506249 | 3/2007 |
| JP | 09-219289 | 9/2009 |

* cited by examiner

*Primary Examiner* — Dawn L. Garrett
(74) *Attorney, Agent, or Firm* — Riverside Law LLP

(57) ABSTRACT

A light emitting layer-forming solid material including at least one host material and at least one light-emitting material, wherein the light emitting layer-forming solid material is used for forming a white light emitting layer having a single layer structure by an evaporation method.

9 Claims, 1 Drawing Sheet

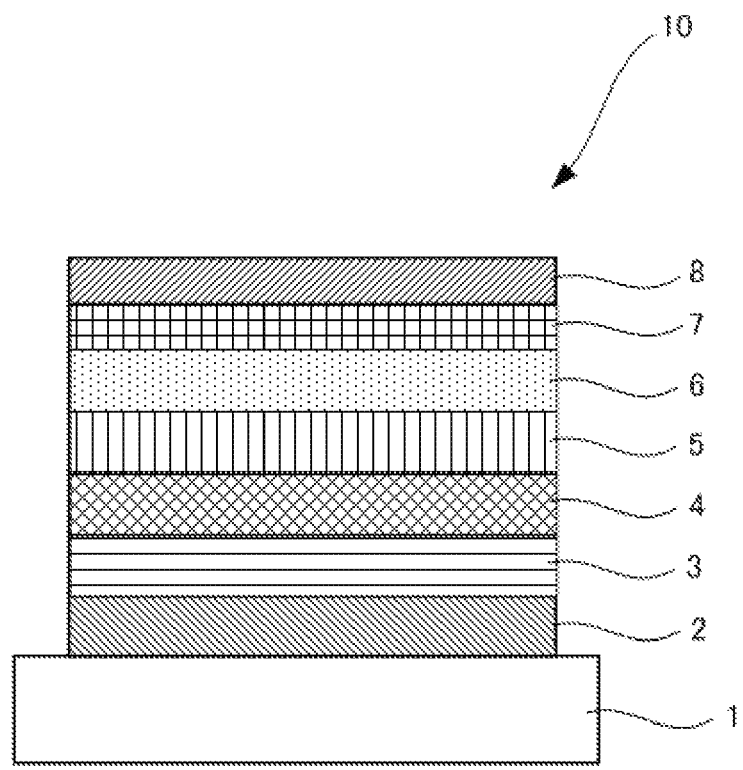

LIGHT EMITTING LAYER-FORMING SOLID MATERIAL, ORGANIC ELECTROLUMINESCENT DEVICE AND METHOD FOR PRODUCING THE SAME

BACKGROUND OF THE INVENTION

1. Field of the Invention

The present invention relates to a light emitting layer-forming solid material, an organic electroluminescent device (hereinafter may be referred to as "organic electroluminescence device" or "organic EL device") and a method for producing the organic electroluminescent device.

2. Description of the Related Art

Conventionally, in formation of a white light emitting layer having a single layer structure, the dopant concentration must be controlled to be 1% by mass or less, and thus, a large-scale production of the white light emitting layer cannot be attained by a generally used co-evaporation method (see U.S. Pat. No. 5,683,823 and Japanese Patent Application Laid-Open (JP-A) No. 2004-228088).

Then, JP-A No. 2004-228088 discloses a method for producing a white light emitting layer by combining a plurality of light emitting layers formed from the corresponding light emitting layer-forming solid materials. As compared to the co-evaporation method, the layer formation is improved by this method. Nevertheless, this method requires separate solid materials corresponding to the light emitting layers, and also requires separate evaporation cells. As a result, the evaporation system becomes complicated and a time-consuming step is required in which the cells are filled with the materials.

In addition, an evaporation film formed from a pellet of several materials mixed may have a different composition from that being expected, since the materials have different sublimation temperatures. This problem has not yet been addressed by prior arts, and the compositions of solid materials have not yet been designed satisfactorily. Especially when powders of phosphorescent light-emitting materials (serving as light-emitting materials) are co-evaporated, device characteristics are not stable due to water or oxygen adsorbed on the surfaces of the powders, which is problematic.

Furthermore, JP-A No. 2003-249359 discloses that an organic light-emitting material and a thermally conductive material are pelletized into a solid. However, this literature has no description about the use of a phosphorescent light-emitting material as the organic light-emitting material. According to Examples thereof, a green-light emitting material Alq is used, and a white light-emitting layer having a single layer structure cannot be formed through evaporation of only one type of solid material.

Therefore, at present, keen demand has arisen for a light emitting layer-forming solid material, an organic electroluminescent device and a method for producing the organic electroluminescent device in which the heating temperature for the evaporation source (evaporation cell temperature) is changed while using only one type of light emitting layer-forming solid material, thereby controlling the composition of the resultant evaporation film, requiring no difficult-to-control co-evaporation, reducing variation in device performances and improving repetitive reproducibility.

BRIEF SUMMARY OF THE INVENTION

An object of the present invention is to provide a light emitting layer-forming solid material, an organic electroluminescent device and a method for producing the organic electroluminescent device in which the heating temperature of the evaporation source (evaporation cell temperature) is changed while using one type of light emitting layer-forming solid material, thereby controlling the composition of the resultant evaporation film, requiring no difficult-to-control co-evaporation, reducing variation in device performances and improving repetitive reproducibility.

The present inventor conducted extensive studies to solve the above existing problems, and has found that the heating temperature of the evaporation source (evaporation cell temperature) is changed while using one type of light emitting layer-forming solid material, thereby controlling the composition of the resultant evaporation film, requiring no difficult-to-control co-evaporation, reducing variation in device performances and improving repetitive reproducibility.

Also, according to another finding obtained by the present inventor, advantageous effects obtained when a phosphorescent light-emitting material is formed into a solid material are greater than those obtained when a fluorescent light-emitting material is formed into a solid material. One reason for this is that a solid material has a smaller surface area than that of powder and thus is not easily affected by water or oxygen. Another reason is that the phosphorescent light-emitting material is more susceptible to water or oxygen than the fluorescent light-emitting material. Specifically, the solid phosphorescent light-emitting material exhibits greater effects of improving device characteristics (emission efficiency and service life) as compared with the solid fluorescent light-emitting material, since adsorption of water or oxygen can be reduced on the surface of the phosphorescent light-emitting material.

Furthermore, the present inventor has found that addition of a thermally conductive material to the light emitting layer-forming solid material effectively suppresses generation of static electrical charges by virtue of electrical conductivity of the thermally conductive material, to thereby prevent adsorption of dust and impurities due to static electrical charges.

In the present invention, the amount by mass of the light emitting layer-forming solid material is adjusted considering sublimation properties of the materials, so that a white light emitting layer having a single layer structure and a desired composition can be obtained at a desired evaporation rate. Moreover, the present inventor has found that the heating temperature of the heating source is adjusted to variably control the composition of a light emitting layer having a single layer structure, whereby the emission spectrum can be changed to control color temperature and color rendering properties.

The present invention is based on the above findings obtained by the present inventor. Means for solving the above existing problems are as follows.

<1> A light emitting layer-forming solid material, including:
at least one host material, and
at least one light-emitting material,
wherein the light emitting layer-forming solid material is used for forming a white light emitting layer having a single layer structure by an evaporation method.

<2> The light emitting layer-forming solid material according to <1>, wherein the at least one light-emitting material is at least two light-emitting materials.

<3> The light emitting layer-forming solid material according to <2>, wherein the at least two light-emitting materials emit different lights.

<4> The light emitting layer-forming solid material according to any one of <1> to <3>, wherein the at least one light-emitting material is a phosphorescent light-emitting material.

<5> The light emitting layer-forming solid material according to any one of <1> to <4>, wherein a difference between a sublimation temperature of the host material and a sublimation temperature of the light-emitting material is within 20° C. as an absolute value.

<6> The light emitting layer-forming solid material according to any one of <1> to <5>, wherein a difference between a sublimation temperature of the host material and a sublimation temperature of the light-emitting material is within 10° C. as an absolute value.

<7> The light emitting layer-forming solid material according to any one of <1> to <6>, further including at least one thermally conductive material having no sublimation property, and thermal conductivity of the thermally conductive material is higher than that of the other materials contained in the light emitting layer-forming solid material.

<8> The light emitting layer-forming solid material according to any one of <1> to <7>, wherein the light emitting layer-forming solid material is used as an evaporation source to form an evaporation film, and a composition of the evaporation film is changed depending on a heating temperature of the evaporation source.

<9> The light emitting layer-forming solid material according to <8>, wherein the composition of the evaporation film is adjusted by controlling the heating temperature of the evaporation source.

<10> The light emitting layer-forming solid material according to any one of <1> to <9>, wherein the light emitting layer-forming solid material is evaporated to form an evaporation film whose composition is different from a composition of the light emitting layer-forming solid material.

<11> A method for producing an organic electroluminescent device, including:
evaporating a light emitting layer-forming solid material according to any one of <1> to <10> so as to form a light emitting layer.

<12> An organic electroluminescent device obtained by the method according to <11>.

The present invention can provide a light emitting layer-forming solid material, an organic electroluminescent device and a method for producing the organic electroluminescent device in which the heating temperature of the evaporation source is changed while using one type of light emitting layer-forming solid material, thereby controlling the composition of the resultant evaporation film, requiring no difficult-to-control co-evaporation, reducing variation in device performances and improving repetitive reproducibility.

BRIEF DESCRIPTION OF THE DRAWINGS

FIG. 1 is a schematic view of one exemplary organic electroluminescent device of the present invention.

DETAILED DESCRIPTION OF THE INVENTION (Light Emitting Layer-Forming Solid Material)
A light emitting layer-forming solid material of the present invention is a solid material used for forming a white light emitting layer having a single layer structure by an evaporation method, and includes at least one host material and at least one light-emitting material; and, if necessary, further includes a thermally conductive material and other components.

<Host Material>
The host material is not particularly limited and may be appropriately selected depending on the intended purpose. Examples thereof include hole transporting host materials having excellent hole transporting properties and electron transporting host materials having excellent electron transporting properties.
—Hole Transporting Host Material—
The hole transporting host material is not particularly limited and may be appropriately selected depending on the intended purpose. Examples of the hole transporting host material include pyrrole, indole, carbazole, azaindole, azacarbazole, pyrazole, imidazole, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, aromatic dimethylidine compounds, porphyrin compounds, polysilane compounds, poly(N-vinylcarbazole), aniline copolymers, conductive high-molecular-weight oligomers (e.g., thiophene oligomers and polythiophenes), organic silanes, carbon films and derivatives thereof.

Among them, preferred are indole derivatives, carbazole derivatives, azaindole derivatives, azacarbazole derivatives, aromatic tertiary amine compounds and thiophene derivatives. More preferred are compounds having, in their molecule, an indole skeleton, a carbazole skeleton, an azaindole skeleton, an azacarbazole skeleton or an aromatic tertiary amine skeleton. Particularly preferred are compound having a carbazole skeleton in their molecule.

Also, in the present invention, host materials part or all of the hydrogen atoms of which have been substituted by deuterium may be used (JP-A Nos. 2009-277790 and 2004-515506).

Specific examples of the hole transporting host material include the following compounds, but employable hole transporting host materials are not limited thereto.

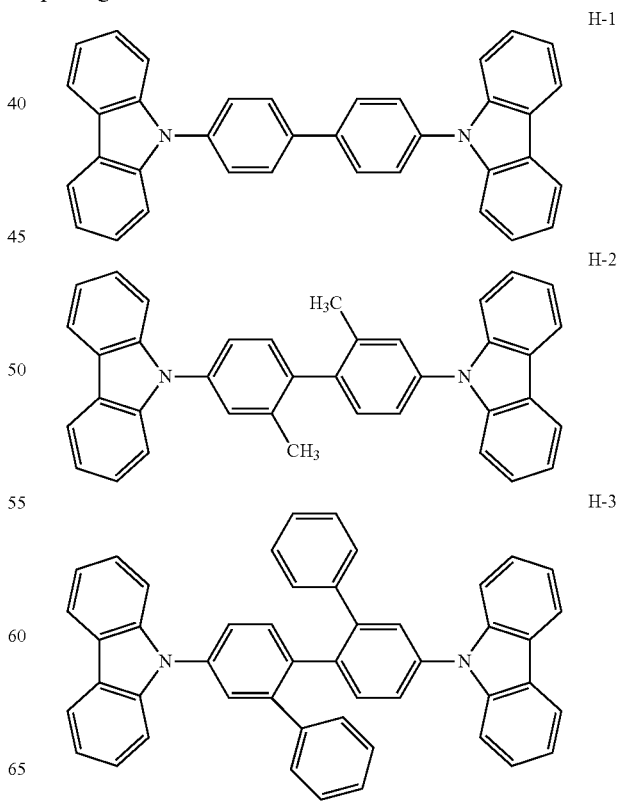

H-4
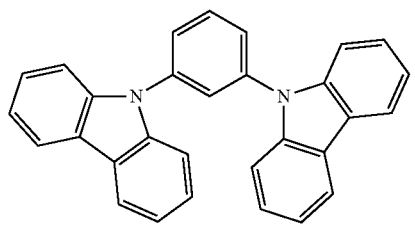
H-5
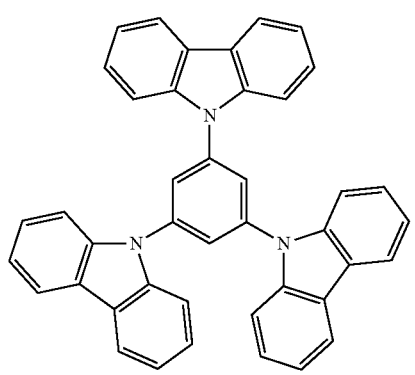
H-6
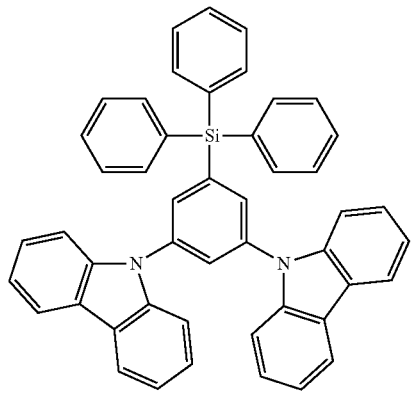
H-7
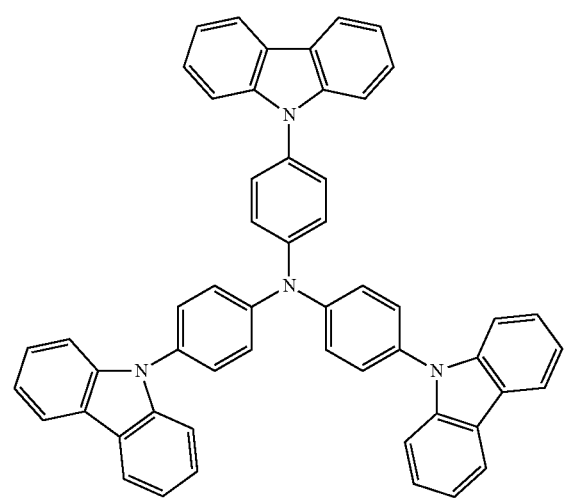
H-8
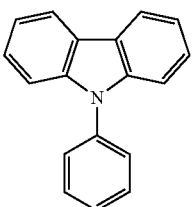
H-9
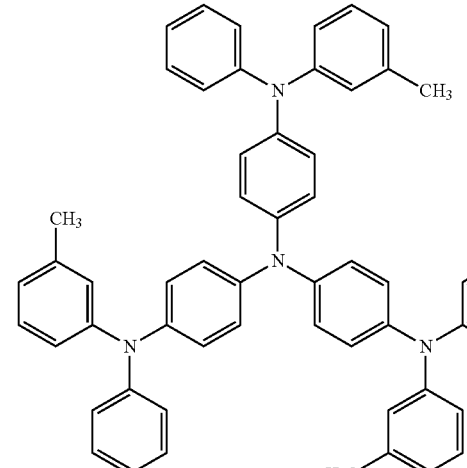
H-10
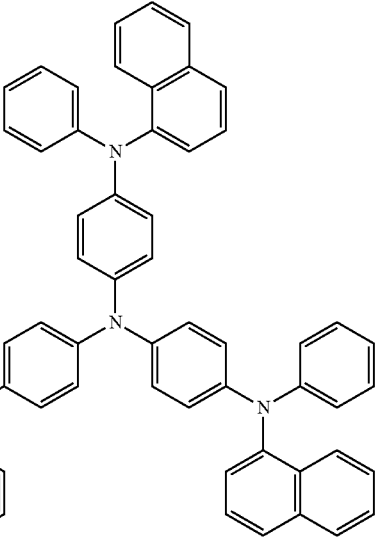

H-11
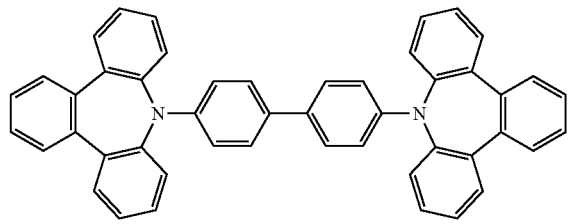
H-12
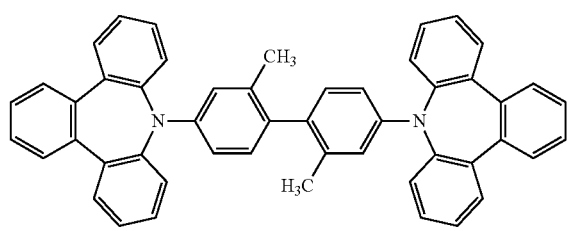
H-13
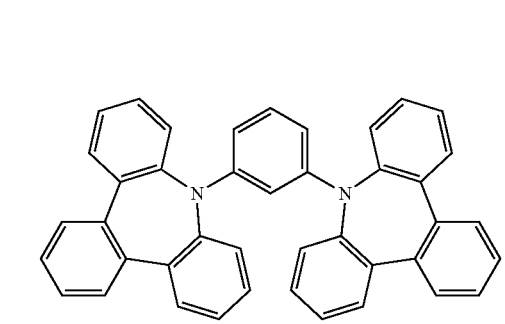
H-14
H-15
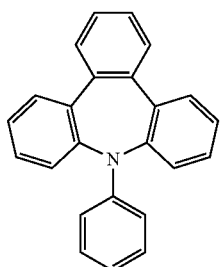
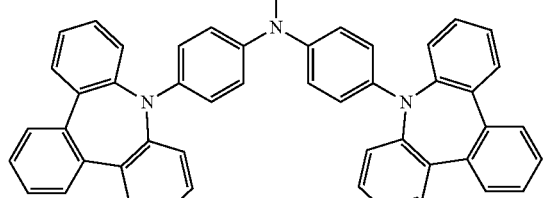
H-16
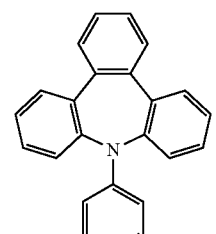
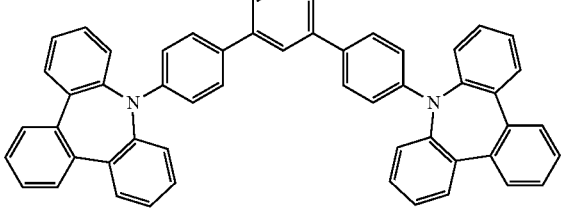
H-17
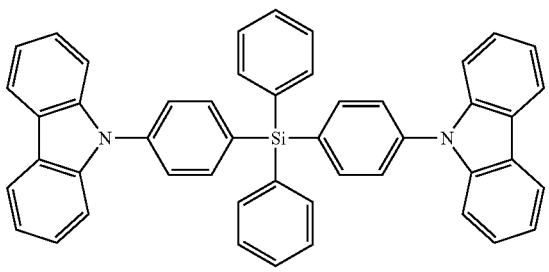
H-18
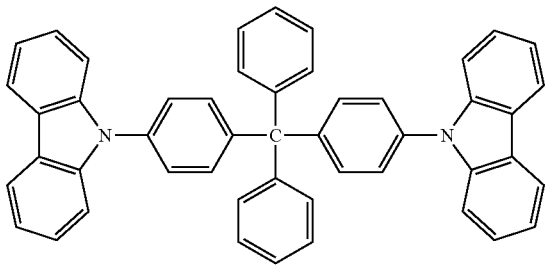

H-19
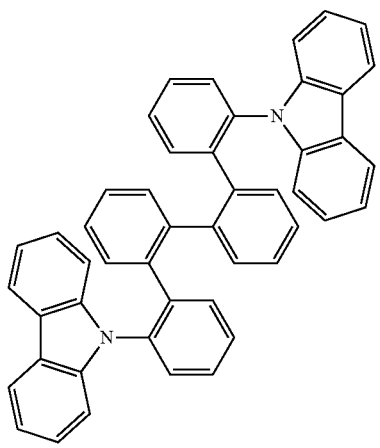
H-20
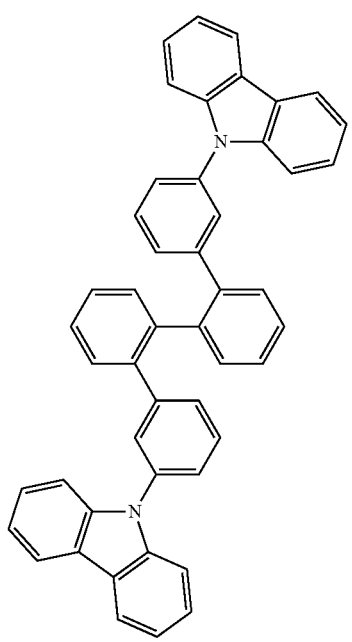
H-21
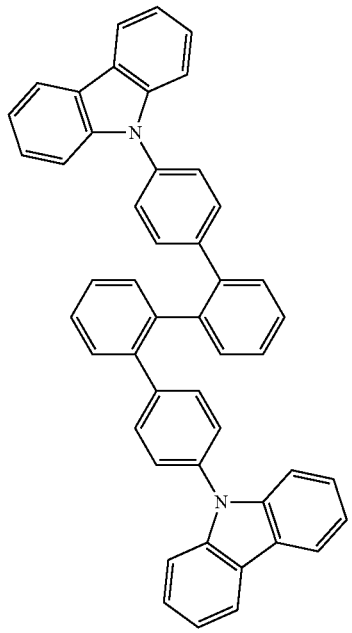
H-22
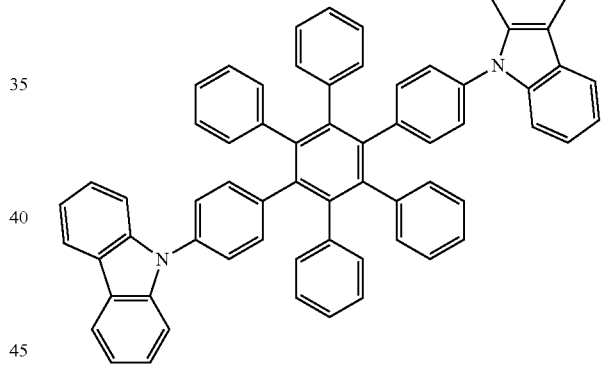
H-23
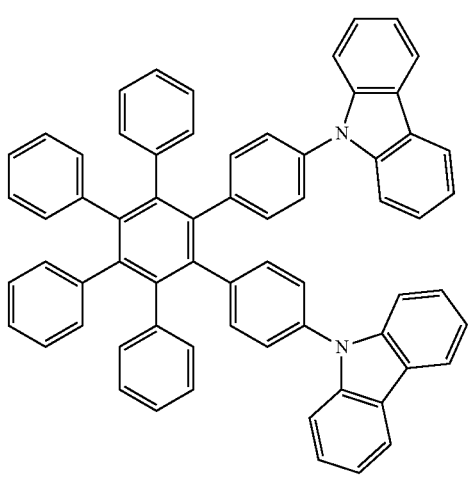

H-24
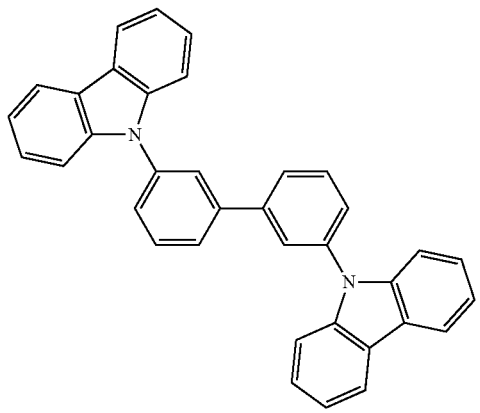

H-25
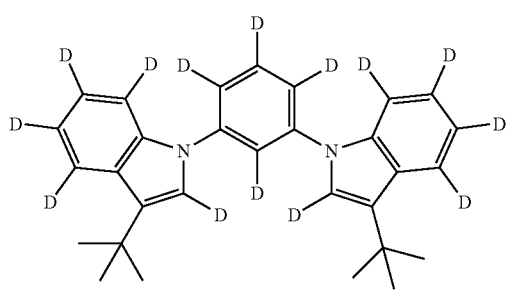

H-26
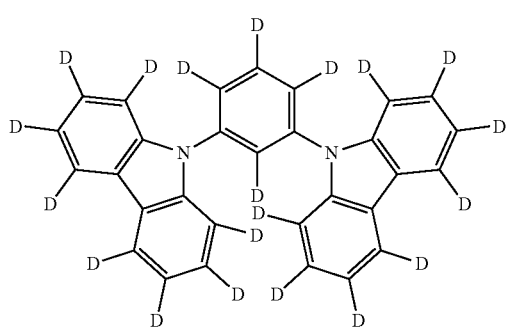

H-27
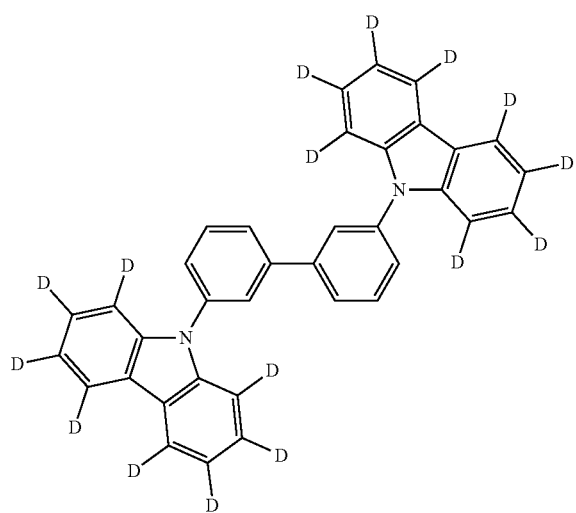

H-28

H-29

H-30

The amount of the hole transporting host material contained in the light emitting layer-forming solid material is preferably 10% by mass to 99.9% by mass, more preferably 20% by mass to 99.5% by mass, still more preferably 30% by mass to 99% by mass.

—Electron Transporting Host Material—

The electron transporting host material is not particularly limited and may be appropriately selected depending on the intended purpose. Examples thereof include pyridine, pyrimidine, triazine, imidazole, pyrazole, triazole, oxazole, oxadiazole, fluorenone, anthraquinodimethane, anthrone, diphenylquinone, thiopyrandioxide, carbodiimide, fluorenylidenemethane, distyrylpyradine, fluorine-substituted aromatic compounds, heterocyclic tetracarboxylic anhydrides (e.g., naphthalene and perylene), phthalocyanine, derivatives thereof (which may form a condensed ring with another ring) and various metal complexes such as metal complexes of 8-quinolynol derivatives, metal phthalocyanine, and metal complexes having benzoxazole or benzothiazole as a ligand.

Further examples of the electron transporting host material include metal complexes, azole derivatives (e.g., benzimidazole derivatives and imidazopyridine derivatives) and azine derivatives (e.g., pyridine derivatives, pyrimidine derivatives and triazine derivatives). Among them, in the present invention, metal complex compounds are preferred in terms of durability. The metal complex compounds are more preferably metal complexes containing a ligand which has at least one nitrogen atom, oxygen atom, or sulfur atom and which is coordinated with the metal.

The metal ion contained in the metal complexes is not particularly limited and may be appropriately selected depending on the intended purpose. It is preferably a beryllium ion, a magnesium ion, an aluminum ion, a gallium ion, a zinc ion, an indium ion, a tin ion, a platinum ion or a palladium ion; more preferably a beryllium ion, an aluminum ion, a gallium ion, a zinc ion, a platinum ion or a palladium ion; particularly preferably an aluminum ion, a zinc ion or a palladium ion.

The ligand contained in the metal complexes is not particularly limited and may be appropriately selected depending on the intended purpose. Examples thereof include those described in, for example, "Photochemistry and Photophysics of Coordination Compounds" authored by H. Yersin, published by Springer-Verlag Company in 1987; and "YUHKI KINZO KUKAGAKU—KISO TO OUYOU—(Metalorganic Chemistry—Fundamental and Application—)" authored by Akio Yamamoto, published by Shokabo Publishing Co., Ltd. in 1982.

The ligand is, for example, nitrogen-containing heterocyclic ligands (preferably having 1 to 30 carbon atoms, more preferably 2 to 20 carbon atoms, particularly preferably 3 to 15 carbon atoms). It may be a unidentate ligand or a bi- or higher-dentate ligand. Preferred are bi- to hexa-dentate ligands, and mixed ligands of bi- to hexa-dentate ligands with a unidentate ligand.

Examples of the ligand include azine ligands (e.g., pyridine ligands, bipyridyl ligands and terpyridine ligands); hydroxyphenylazole ligands (e.g., hydroxyphenylbenzoimidazole ligands, hydroxyphenylbenzoxazole ligands, hydroxyphenylimidazole ligands and hydroxyphenylimidazopyridine ligands) alkoxy ligands (those having preferably 1 to 30 carbon atoms, more preferably 1 to 20 carbon atoms, particularly preferably 1 to 10 carbon atoms, such as methoxy, ethoxy, butoxy and 2-ethylhexyloxy); and aryloxy ligands (those having preferably 6 to 30 carbon atoms, more preferably 6 to 20 carbon atoms, particularly preferably 6 to 12 carbon atoms, such as phenyloxy, 1-naphthyloxy, 2-naphthyloxy, 2,4,6-trimethylphenyloxy and 4-biphenyloxy), heteroaryloxy ligands (those having preferably 1 to 30 carbon atoms, more preferably 1 to 20 carbon atoms, particularly preferably 1 to 12 carbon atoms, examples of which include pyridyloxy, pyrazyloxy, pyrimidyloxy and quinolyloxy); alkylthio ligands (those having preferably 1 to 30 carbon atoms, more preferably 1 to 20 carbon atoms, particularly preferably 1 to 12 carbon atoms, examples of which include methylthio and ethylthio); arylthio ligands (those having preferably 6 to 30 carbon atoms, more preferably 6 to 20 carbon atoms, particularly preferably 6 to 12 carbon atoms, examples of which include phenylthio); heteroarylthio ligands (those having preferably 1 to 30 carbon atoms, more preferably 1 to 20 carbon atoms, particularly preferably 1 to 12 carbon atoms, examples of which include pyridylthio, 2-benzimidazolylthio, 2-benzoxazolylthio and 2-benzothiazolylthio);

siloxy ligands (those having preferably 1 to 30 carbon atoms, more preferably 3 to 25 carbon atoms, particularly preferably 6 to 20 carbon atoms, examples of which include a triphenylsiloxy group, a triethoxysiloxy group and a triisopropylsiloxy group); aromatic hydrocarbon anion ligands (those having preferably 6 to 30 carbon atoms, more preferably 6 to 25 carbon atoms, particularly preferably 6 to 20 carbon atoms, examples of which include a phenyl anion, a naphthyl anion and an anthranyl anion); aromatic heterocyclic anion ligands (those having preferably 1 to 30 carbon atoms, more preferably 2 to 25 carbon atoms, particularly preferably 2 to 20 carbon atoms, examples of which include a pyrrole anion, a pyrazole anion, a triazole anion, an oxazole anion, a benzoxazole anion, a thiazole anion, a benzothiazole anion, a thiophene anion and a benzothiophene anion); and indolenine anion ligands. Among them, nitrogen-containing heterocyclic ligands, aryloxy ligands, heteroaryloxy groups, siloxy ligands, etc. are more preferred, and nitrogen-containing heterocyclic ligands, aryloxy ligands, siloxy ligands, aromatic hydrocarbon anion ligands, aromatic heterocyclic anion ligands, etc. are still more preferred.

The metal complexes used for the electron transporting host material are compounds described in, for example, JP-A Nos. 2002-235076, 2004-214179, 2004-221062, 2004-221065, 2004-221068 and 2004-327313.

Specific examples of the electron transporting host material include the following materials, but employable electron transporting host materials are not limited thereto.

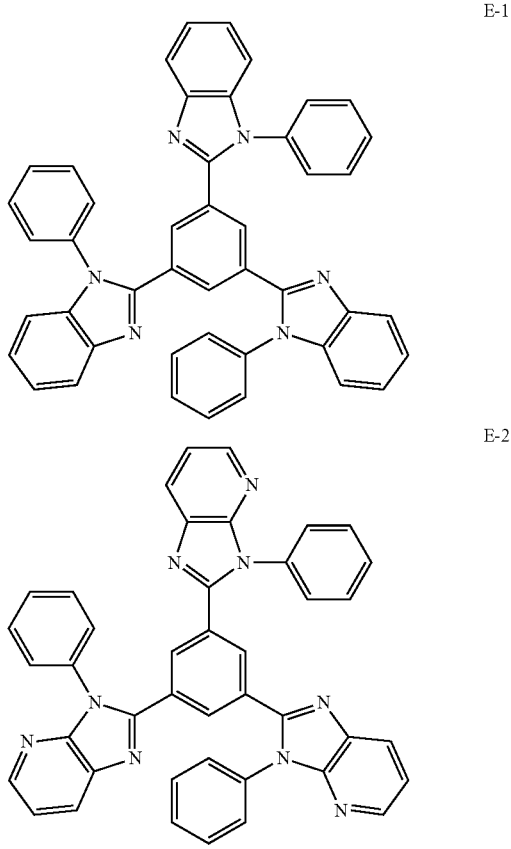

E-1

E-2

E-3
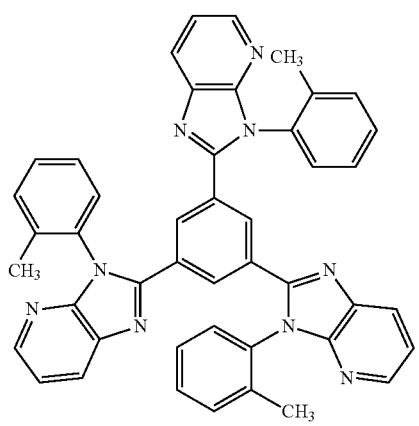
E-4
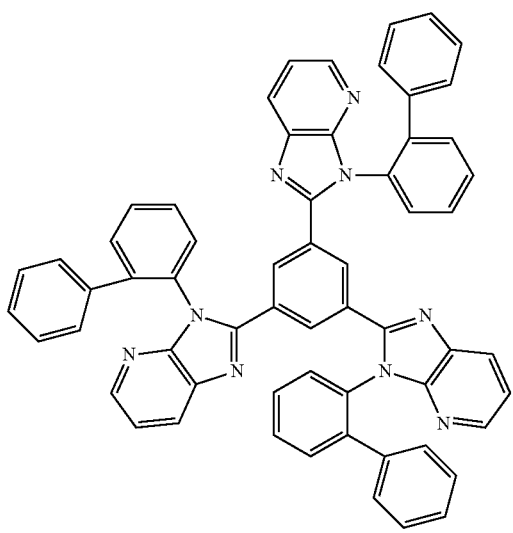
E-5
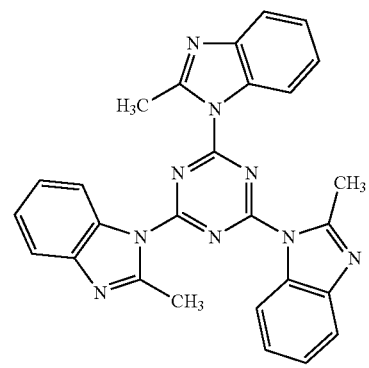
E-6
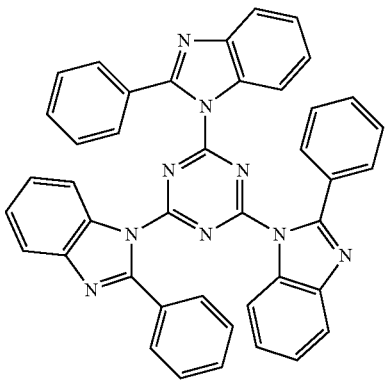
E-7
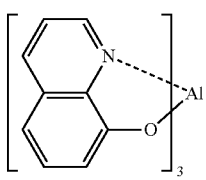
E-8
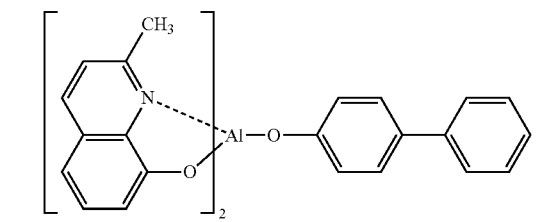
E-9
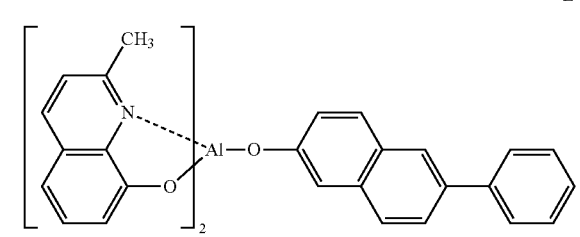
E-10
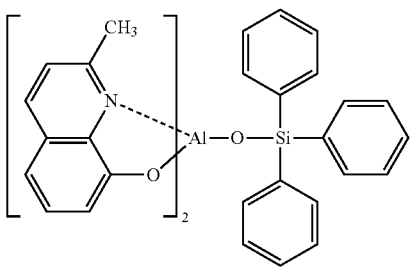
E-11
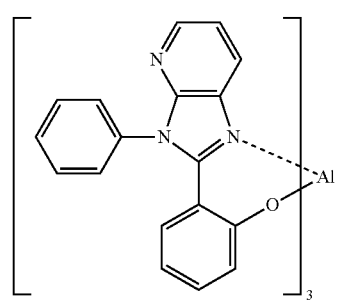

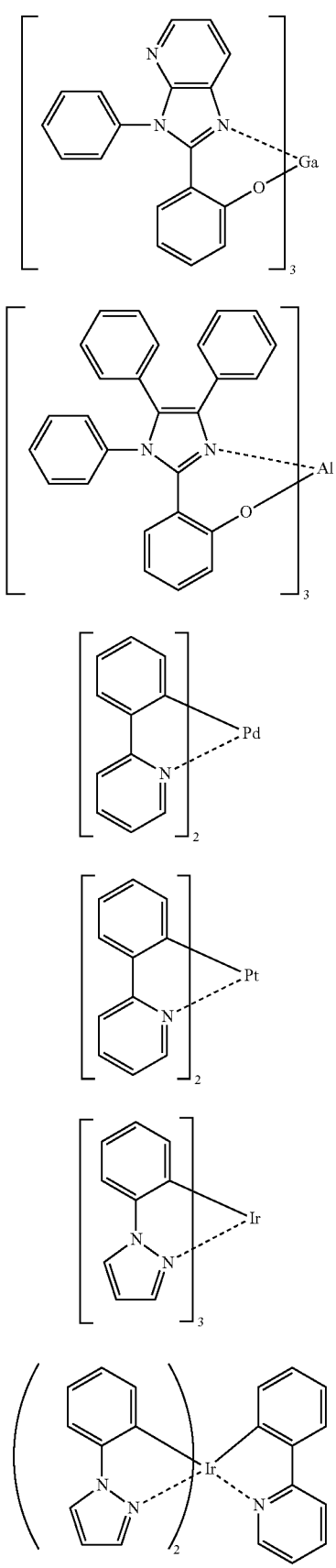
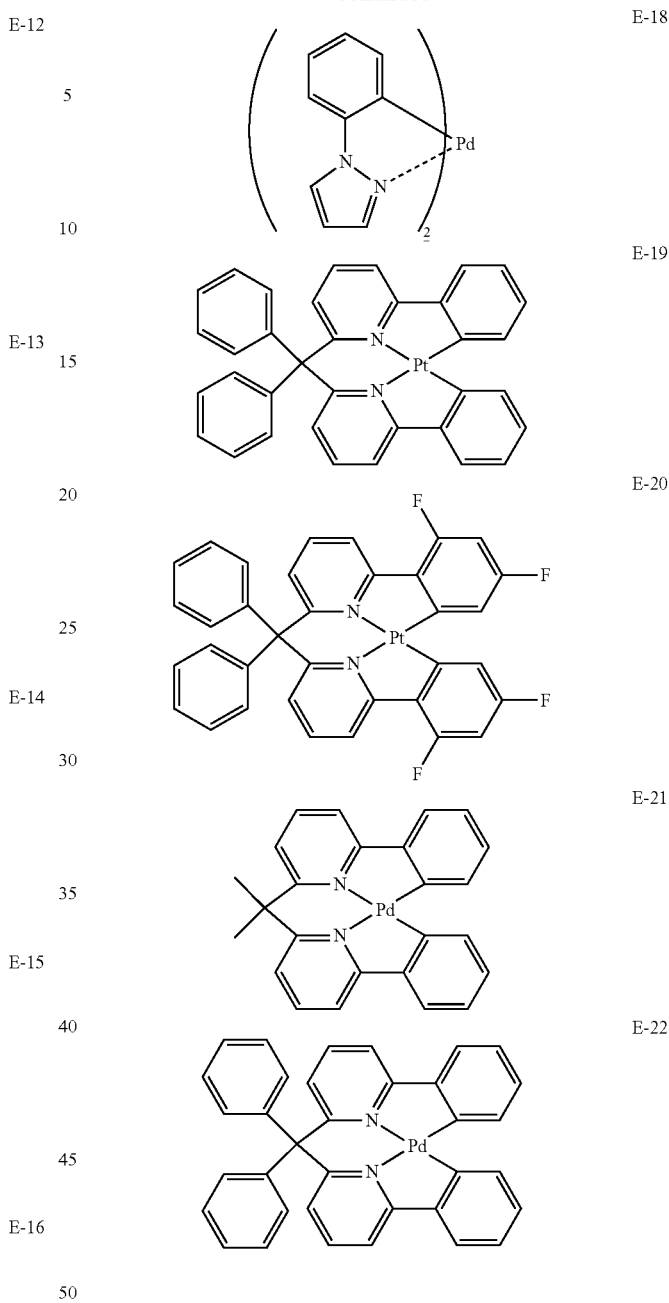

The amount of the electron transporting host material is preferably 10% by mass to 99.9% by mass, more preferably 20% by mass to 99.5% by mass, still more preferably 30% by mass to 99% by mass, relative to the total amount of the light emitting layer-forming solid material.

<Light-Emitting Material>

The light-emitting material may be any of a phosphorescent light-emitting material and a fluorescent light-emitting material. The phosphorescent light-emitting material is preferable as compared with the fluorescent light-emitting material, since the phosphorescent light-emitting material exhibits higher light-emission efficiency. In addition, when the phosphorescent light-emitting material, which is more susceptible to water or oxygen than in the fluorescent light-emitting material, is formed into a solid, adverse effects caused by water or oxygen from the outside can be minimized. The resultant phosphorescent light-emitting material in solid form has improved performances (light-emission efficiency and service life) as compared with conventional phosphorescent light-emitting materials in powder form, which is particularly preferred.

Examples of the light-emitting material include (1) a material emitting white light by itself through association emission and (2) a material containing at least two light-emitting materials emitting lights of different colors.

—(1) Material Emitting White Light by Itself through Association Emission—

The material emitting white light by itself through association emission is preferably a phosphorescent light-emitting material, more preferably a platinum complex.

Examples of the ligand of the platinum complex include those described in, for example, "Comprehensive Coordination Chemistry" authored by G. Wilkinson et al., published by Pergamon Press Company in 1987; "Photochemistry and Photophysics of Coordination Compounds" authored by H. Yersin, published by Springer-Verlag Company in 1987; and "*YUHKI KINZO KUKAGAKU—KISO TO OUYOU*—(Metalorganic Chemistry—Fundamental and Application—)" authored by Akio Yamamoto, published by Shokabo Publishing Co., Ltd. in 1982.

Specific examples of the ligand include halogen ligands (preferably, chlorine ligand); aromatic carbon ring ligands such as cyclopentadienyl anion, benzene anion and naphthyl anion; nitrogen-containing hetero cyclic ligands such as phenyl pyridine, benzoquinoline, quinolinol, bipyridyl and phenanthrorine); diketone ligands such as acetyl acetone; carboxylic acid ligands such as acetic acid ligand; alcoholate ligands such as phenolate ligand; carbon monoxide ligand; isonitrile ligand; and cyano ligand, with nitrogen-containing hetero cyclic ligands being particularly preferred.

The above-described complexes may be a complex containing one transition metal atom in the compound, or a so-called polynuclear complex containing two or more transition metal atoms. In the latter case, the complexes may contain different metal atoms at the same time. Specific examples of the phosphorescent light-emitting material include the following materials, but employable phosphorescent light-emitting materials are not limited thereto.

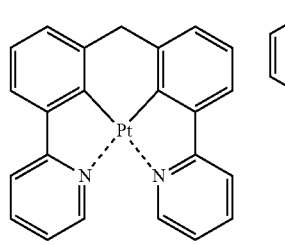

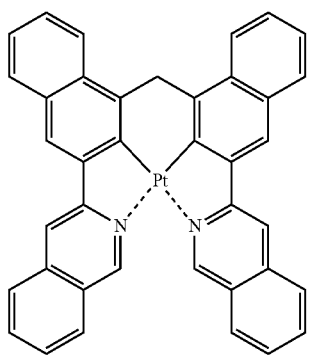

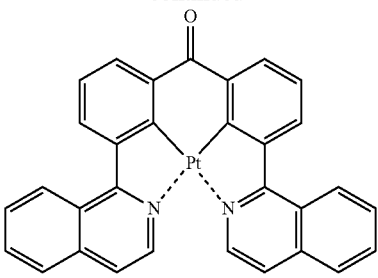

-continued

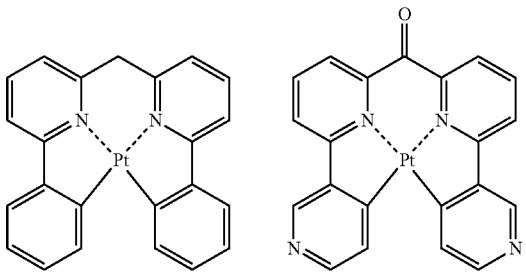

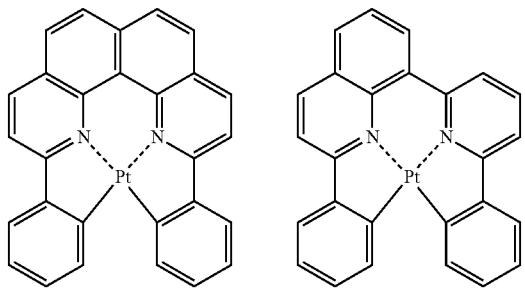

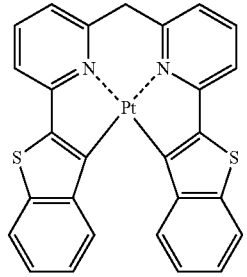

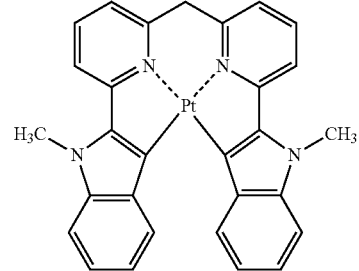

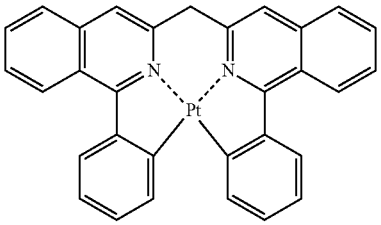

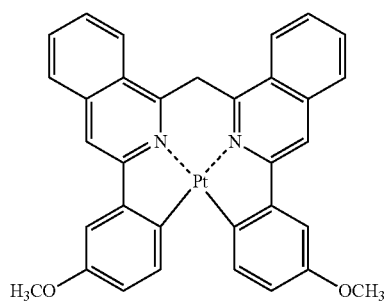
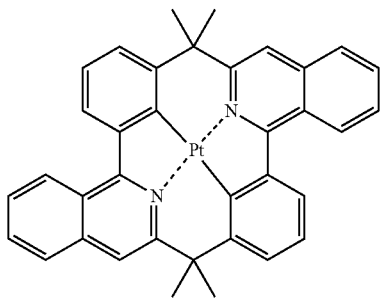
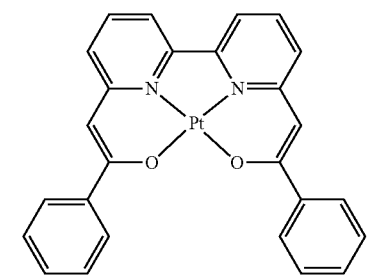
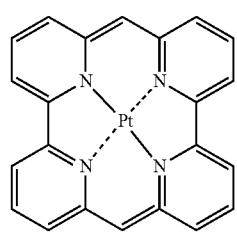
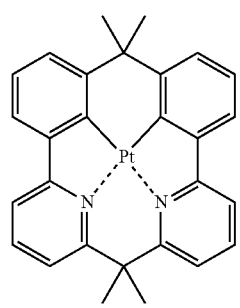
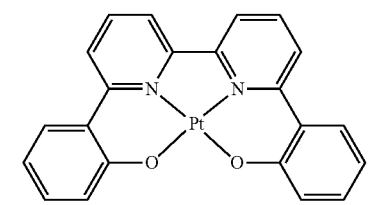
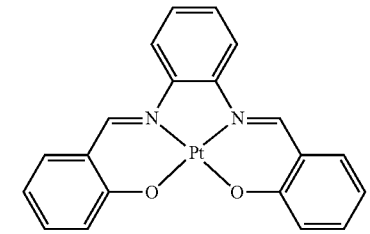
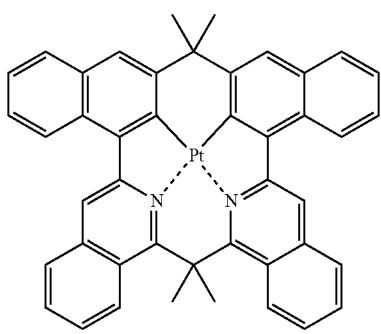
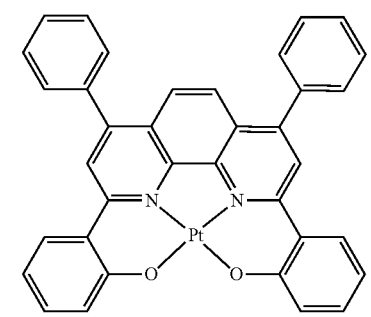
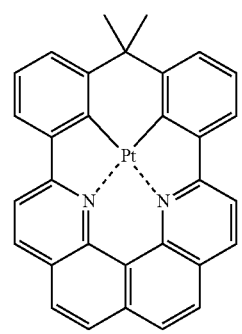
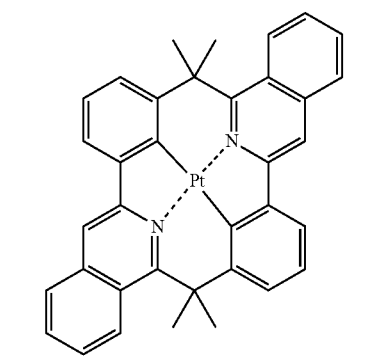
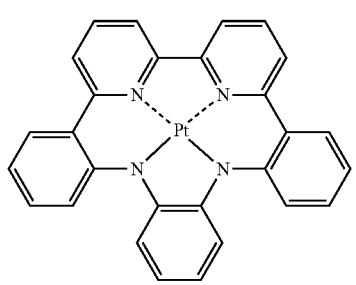

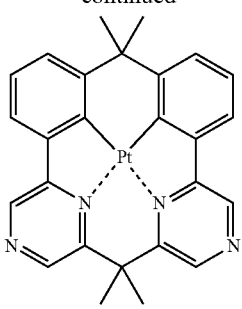
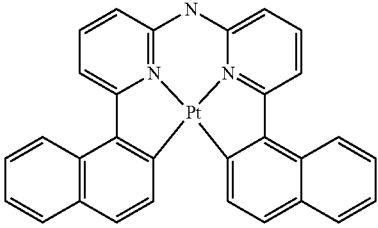
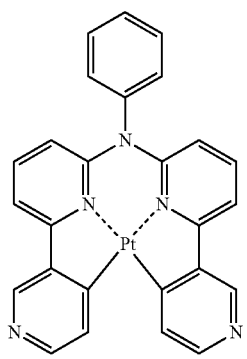
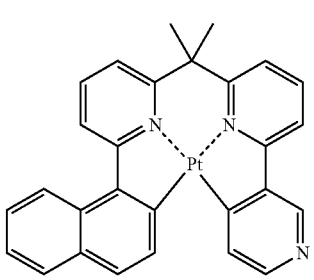
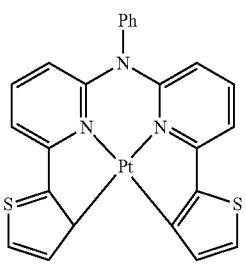
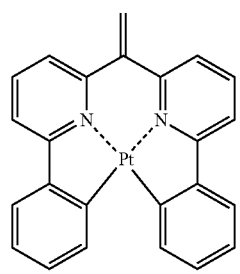
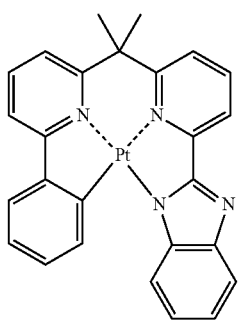
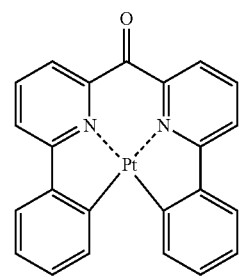
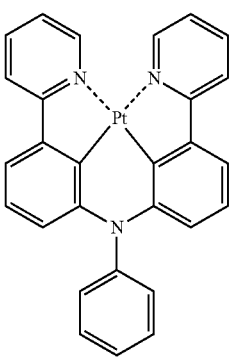
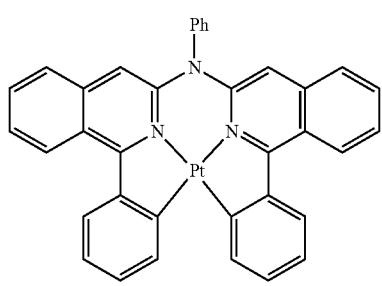
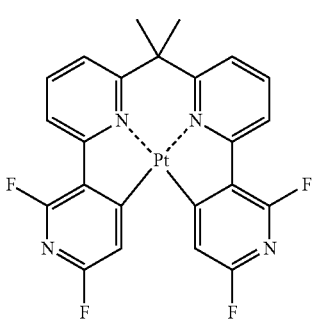
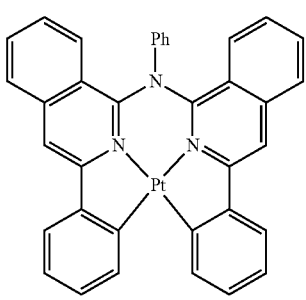
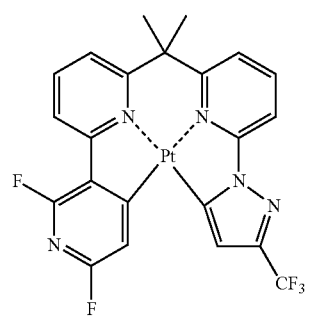

-continued

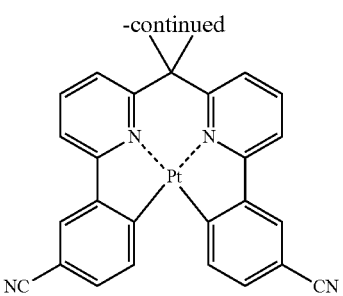

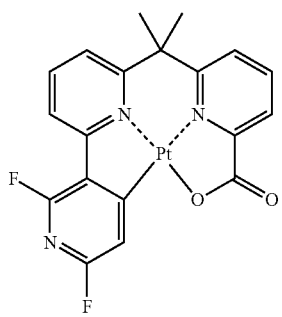

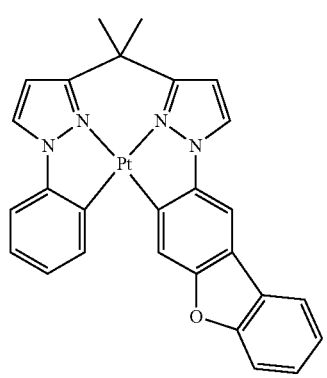

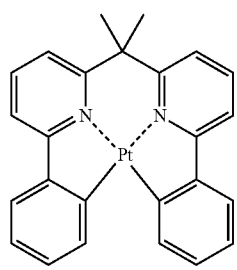

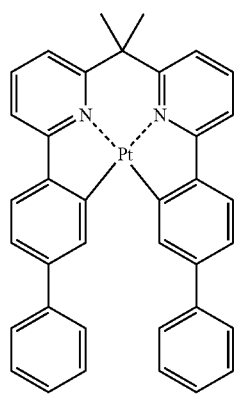

The concentration of the platinum complex (dopant) is preferably 10% by mass to 90% by mass, more preferably 20% by mass to 60% by mass, still more preferably 30% by mass to 50% by mass, relative to the host material.

—(2) Material Containing at Least Two Light-Emitting Materials Emitting Lights of Different Colors—

The material containing at least two light-emitting materials emitting lights of different colors is preferably a mixture containing light-emitting materials emitting lights of several colors for emitting white light, more preferably a mixture of light-emitting materials emitting lights of three different colors of red (R), green (G) and blue (B).

The light-emitting material contained in the material (2) may be any of the phosphorescent light-emitting material and the fluorescent light-emitting material, with the phosphorescent light-emitting material being particularly preferred.

—Phosphorescent Light-Emitting Material—

The phosphorescent light-emitting material is not particularly limited and may be appropriately selected depending on the intended purpose. Examples thereof include complexes containing a transition metal atom or a lanthanoid atom.

Examples of the transition metal atom include ruthenium, rhodium, palladium, tungsten, rhenium, osmium, iridium and platinum, with rhenium, iridium, platinum and iridium being particularly preferred.

Examples of the ligand include those described in, for example, "Comprehensive Coordination Chemistry" authored by G. Wilkinson et al., published by Pergamon Press Company in 1987; "Photochemistry and Photophysics of Coordination Compounds" authored by H. Yersin, published by Springer-Verlag Company in 1987; and "*YUHKI KINZO KUKAGAKU—KISO TO OUYOU*—(Metalorganic Chemistry—Fundamental and Application—)" authored by Akio Yamamoto, published by Shokabo Publishing Co., Ltd. in 1982.

Specific examples of the ligand include halogen ligands (preferably, chlorine ligand); aromatic carbon ring ligands such as cyclopentadienyl anion, benzene anion and naphthyl anion; nitrogen-containing hetero cyclic ligands such as phenyl pyridine, benzoquinoline, quinolinol, bipyridyl and phenanthroline); diketone ligands such as acetyl acetone; carboxylic acid ligands such as acetic acid ligand; alcoholate ligands such as phenolate ligand; carbon monoxide ligand; isonitrile ligand; and cyano ligand, with nitrogen-containing hetero cyclic ligands being particularly preferred.

The above-described complexes may be a complex containing one transition metal atom in the compound, or a so-called polynuclear complex containing two or more transition metal atoms. In the latter case, the complexes may contain different metal atoms at the same time. Specific examples of the phosphorescent light-emitting material include the following materials, but employable phosphorescent light-emitting materials are not limited thereto.

The Ir-containing complex as the phosphorescent light-emitting material is not particularly limited and may be appropriately selected depending on the intended purpose. Preferred are compounds represented by the following General Formulas (1), (2) and (3).

General Formula (1)

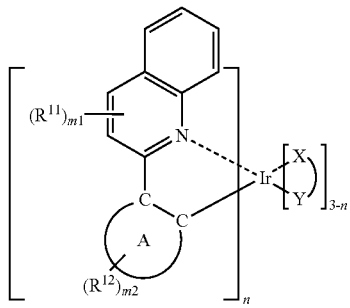

General Formula (2)

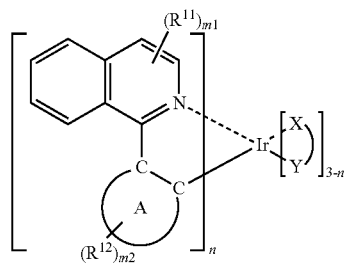

General Formula (3)

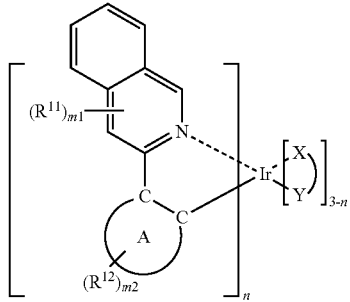

In General Formulas (1), (2) and (3), n is an integer of 1 to 3, X—Y denotes a bidentate ligand, A denotes a ring structure which may contain a nitrogen atom, a sulfur atom or an oxygen atom, $R^{11}$ represents a substituent, m1 is an integer of 0 to 6, when m1 is 2 or greater, the adjacent $R^{11}$s may be bonded to form a ring which may contain a nitrogen atom, a sulfur atom or an oxygen atom and which may have a substituent, $R^{12}$ represents a substituent, m2 is an integer of 0 to 4, when m2 is 2 or greater, the adjacent $R^{12}$s may be bonded to form a ring which may contain a nitrogen atom, a sulfur atom or an oxygen atom and which may have a substituent, and $R^{11}$ and $R^{12}$ may be bonded to form a ring which may contain a nitrogen atom, a sulfur atom or an oxygen atom and which may have a substituent.

The ring A denotes a ring structure which may contain a nitrogen atom, a sulfur atom or an oxygen atom. Preferred examples of the ring structure include 5-membered and 6-membered rings. The ring may have a substituent.

X—Y denotes a bidentate ligand. Preferred examples thereof include bidentate monoanion ligands.

Examples of the bidentate monoanion ligands include picolinate (pic), acetylacetonato (acac) and dipyvaloylmethanato (t-butyl acac).

Examples of other ligands than the above ligands include ligands described on pp. 89 to 91 of International Publication No. WO2002/15645 by Lamansky, et al.

The substituent represented by $R^{11}$ or $R^{12}$ is not particularly limited and may be appropriately selected depending on the intended purpose. Examples thereof include a halogen atom, an alkoxy group, an amino group, an alkyl group, a cycloalkyl group, an aryl group which may contain a nitrogen atom or a sulfur atom, an aryloxy group which may contain a nitrogen atom or a sulfur atom, each of the groups may further contain a substituent.

Regarding the groups represented by $R^{11}$ and $R^{12}$, the adjacent groups may be bonded to form a ring which may contain a nitrogen atom, a sulfur atom or an oxygen atom. Preferred examples of the ring include 5-membered and 6-membered rings. The ring may have a substituent.

Specific examples of the compounds represented by General Formulas (1), (2) and (3) include the following compounds, but employable phosphorescent light-emitting materials are not limited thereto.

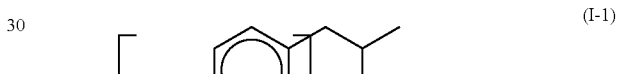

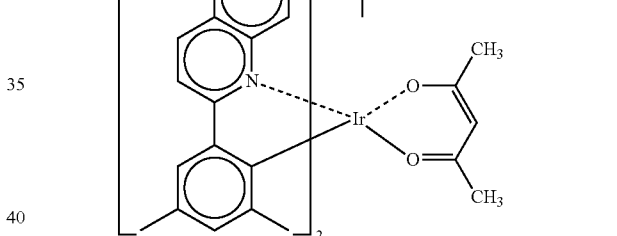

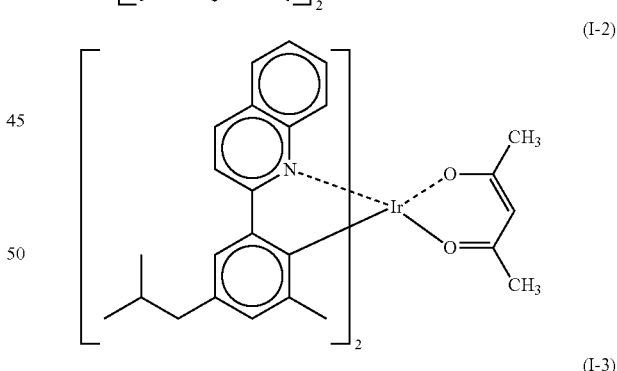

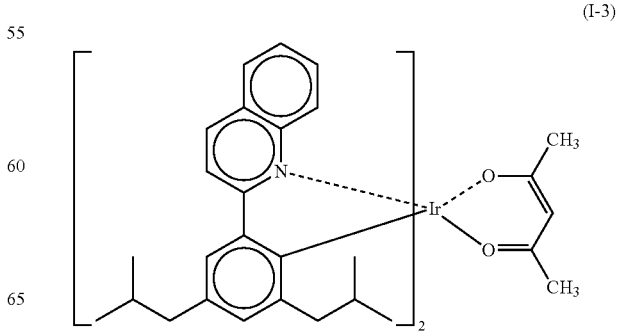

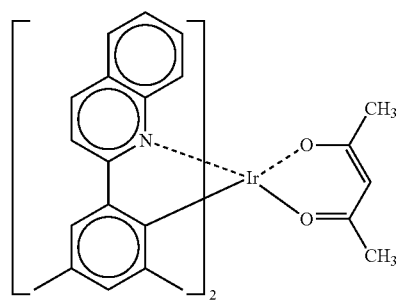
(I-4)
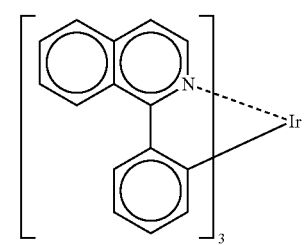
(I-5)
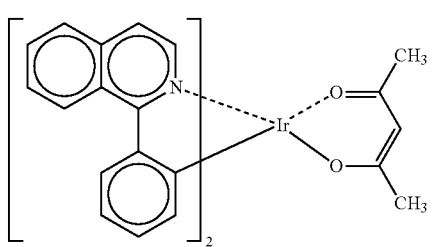
(I-6)
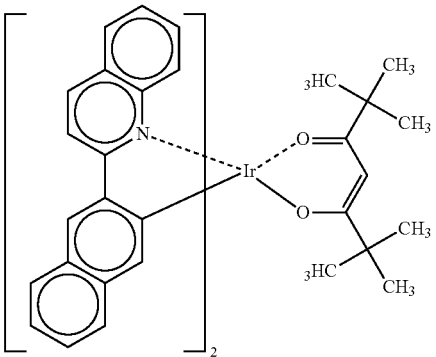
(I-7)
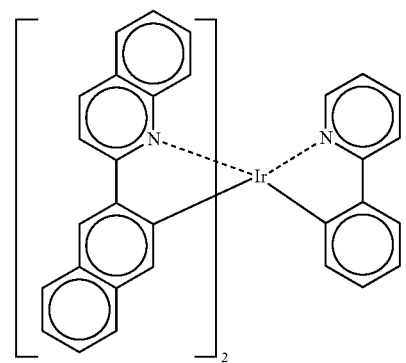
(I-18)
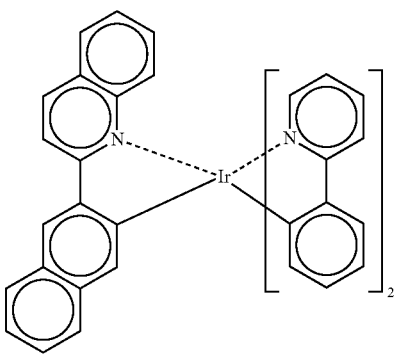
(I-9)
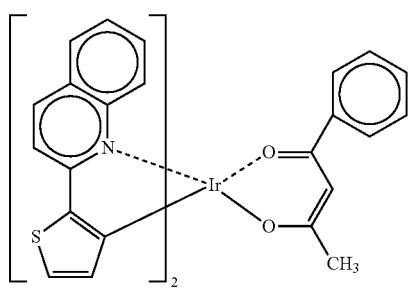
(I-10)
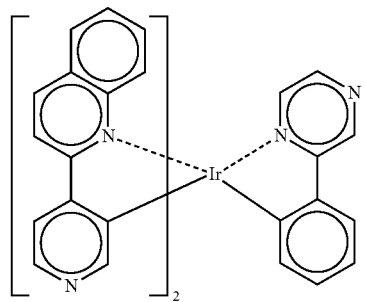
(I-11)
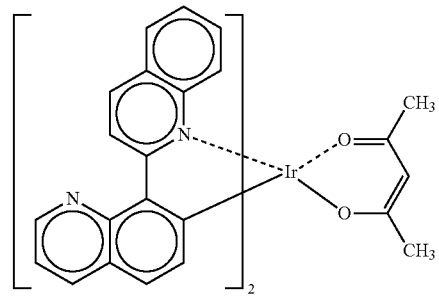
(I-12)
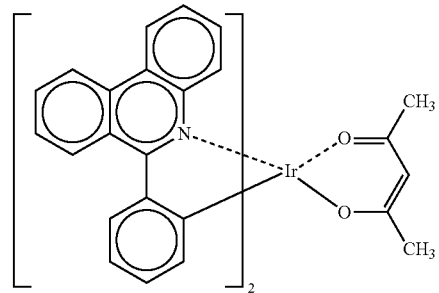
(I-13)

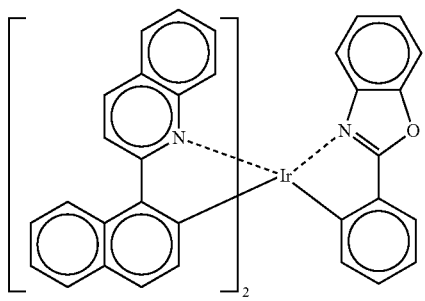
(I-14)
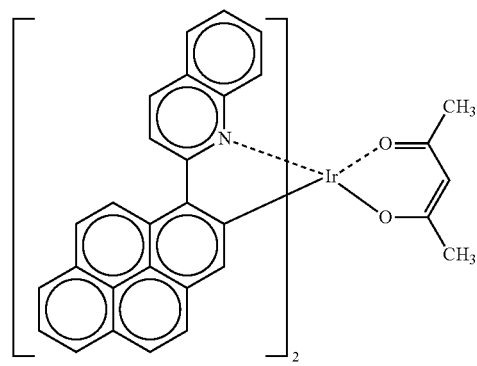
(I-19)
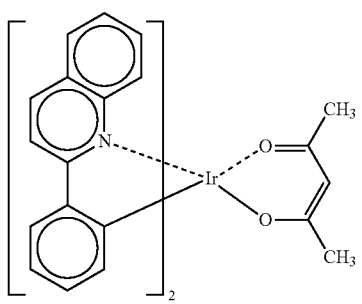
(I-15)
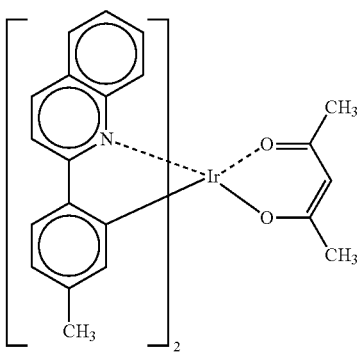
(I-16)
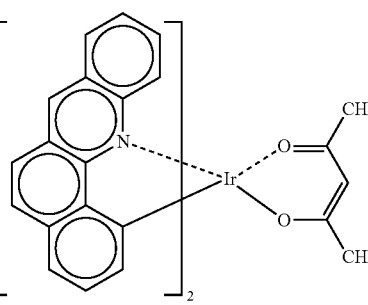
(I-17)
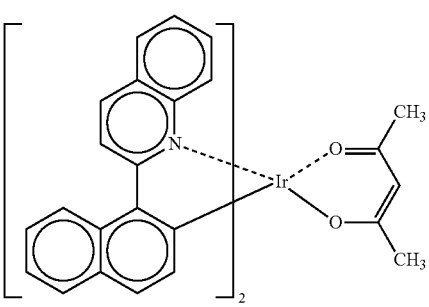
(I-18)
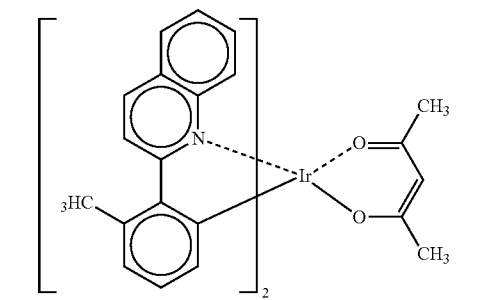
(I-20)
(I-21)
(I-22)

(I-23)
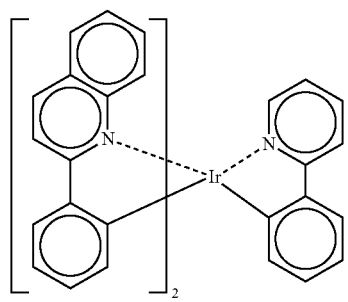
(I-24)
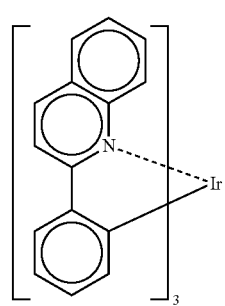
(I-25)
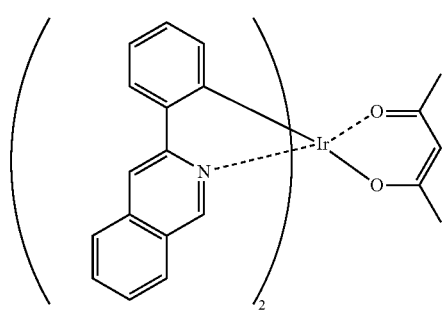
(I-26)
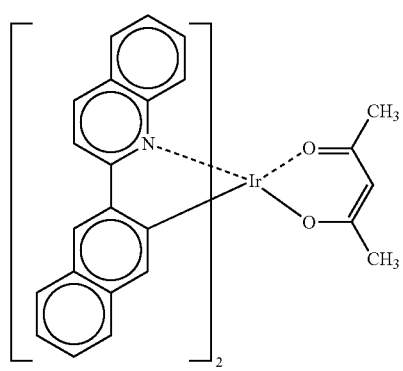
Further examples of the phosphorescent light-emitting material include the following compounds.
D-1
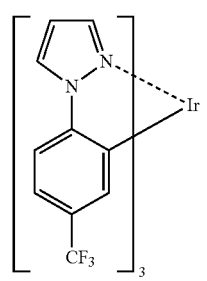
D-2
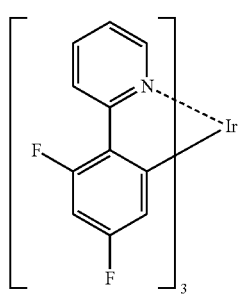
D-3
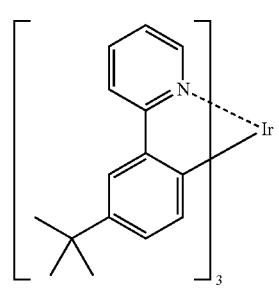
D-4
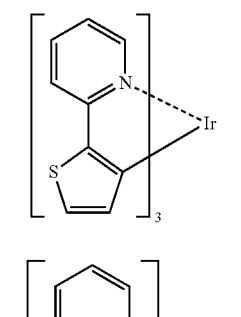
D-5
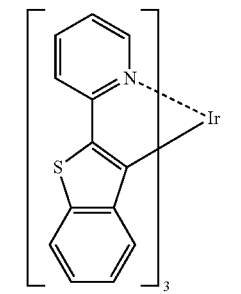
D-6
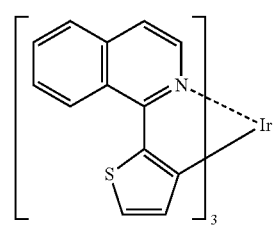
D-7

-continued
D-8
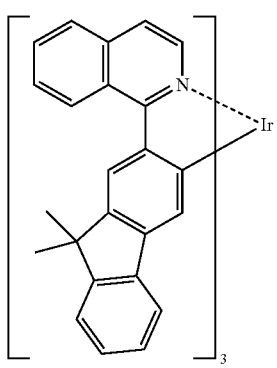
D-9
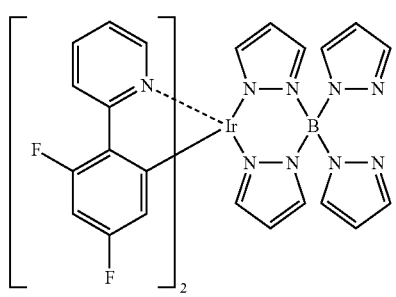
D-10
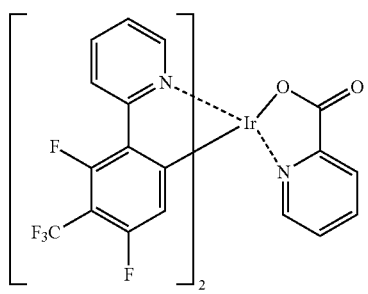
D-11
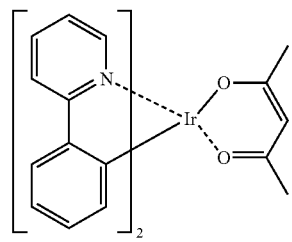
D-12
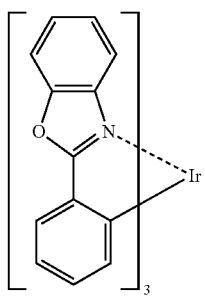
-continued
D-13
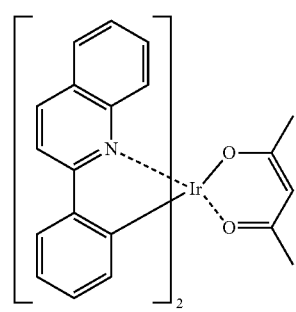
D-14
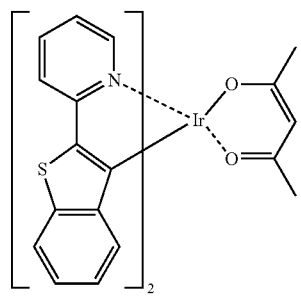
D-15
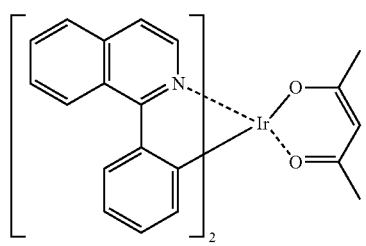
D-16
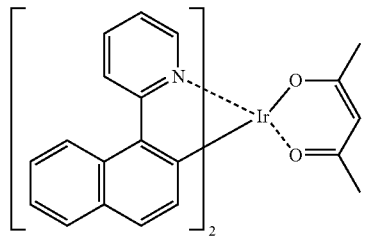
D-17
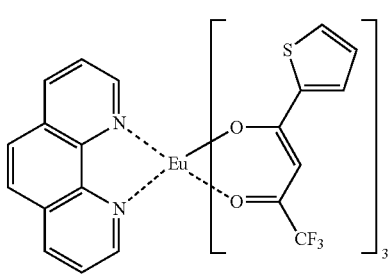

D-18 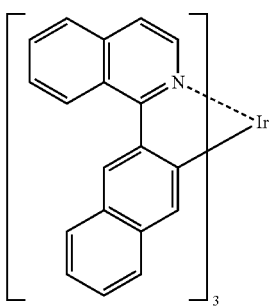

D-19 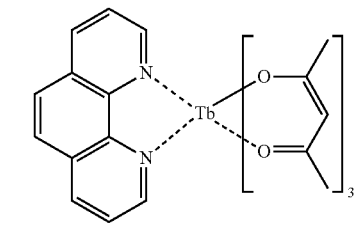

D-20 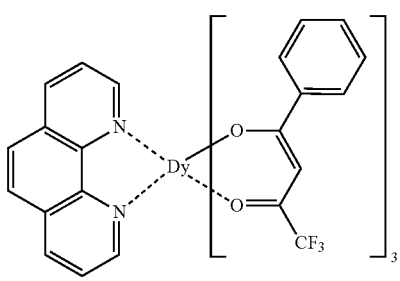

D-21 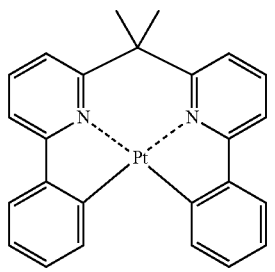

D-22 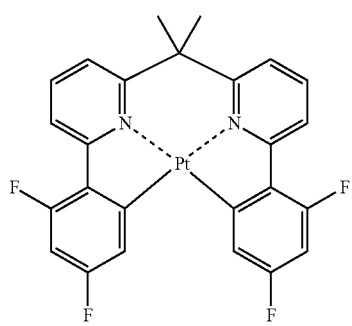

D-23 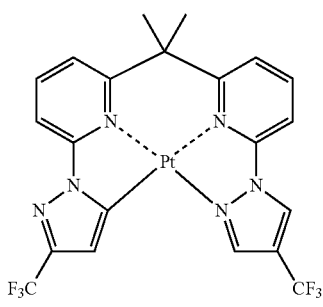

D-24 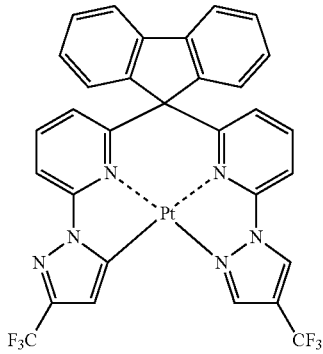

The total amount of the phosphorescent light-emitting material is preferably 0.5% by mass to 30% by mass, more preferably 0.5% by mass to 20% by mass, still more preferably 3% by mass to 10% by mass, relative to the total amount of the light emitting layer-forming solid material.

——Fluorescent Light-Emitting Material——

The fluorescent light-emitting material is not particularly limited and may be appropriately selected depending on the intended purpose. Examples thereof include benzoxazole, benzimidazole, benzothiazole, styrylbenzene, polyphenyl, diphenylbutadiene, tetraphenylbutadiene, naphthalimide, coumarin, pyran, perinone, oxadiazole, aldazine, pyralidine, cyclopentadiene, styrylamine, aromatic dimethylidyne compounds, condensed polycyclic aromatic compounds (e.g., anthracene, phenanthroline, pyrene, perylene, rubrene and pentacene), various metal complexes (e.g., metal complexes of 8-quinolinol, pyrromethene complexes and rare-earth complexes), polymer compounds (e.g., polythiophene, polyphenylene and polyphenylenevinylene), organic silanes and derivatives thereof.

Specific examples of the fluorescent light-emitting material include the following compounds, but employable fluorescent light-emitting materials are not limited thereto.

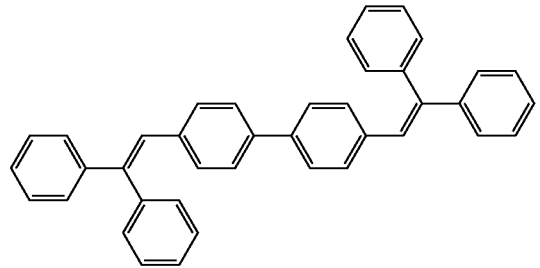

-continued

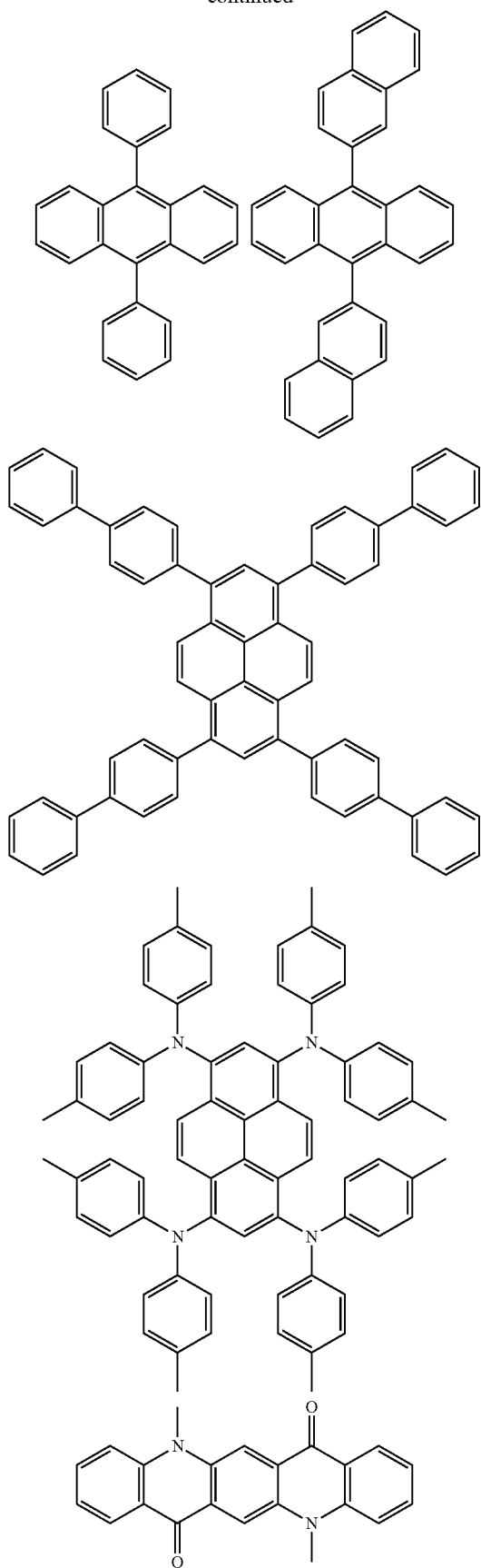

-continued

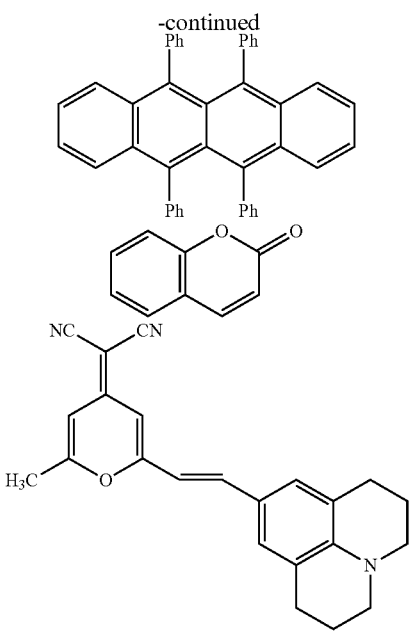

The total amount of the fluorescent light-emitting material is preferably 0.1% by mass to 30% by mass, more preferably 0.2% by mass to 15% by mass, further preferably 0.5% by mass to 12% by mass, relative to the total amount of the light emitting layer-forming solid material.

The difference between the sublimation temperature of the host material and the sublimation temperature of the light-emitting material is preferably within 20° C., more preferably within 10° C. When the difference between the sublimation temperature of the host material and the sublimation temperature of the light-emitting material is greater than 20° C. as an absolute value, a small change in heating temperature of the evaporation source greatly changes the composition of the resultant film, potentially leading to large variation in device characteristics.

Here, the sublimation temperature refers to a temperature at which the mass of a substance is decreased by 10% by mass when measured in vacuum through TG-DTA.

Here, the heating temperature of the evaporation source refers to a temperature that is the same as the temperature of the evaporation cell.

—Thermally Conductive Material—

The light emitting layer-forming solid material preferably contains at least one thermally conductive material having no sublimation property, since the light emitting layer-forming solid material can be uniformly heated to suppress thermo-decomposition of the materials due to local heating.

The thermally conductive material is not particularly limited and may be appropriately selected depending on the intended purpose. Examples thereof include thermally-conductive carbides, nitrides and metals. Specific examples thereof include SiC, diamond, tungsten, Cu, graphite, BN, AlN, WC and TiC, with SiC being particularly preferred.

The amount of the thermally conductive material having no sublimation property is preferably 10% by mass to 90% by mass relative to the total amount of the light emitting layer-forming solid material.

If necessary, the light emitting layer-forming solid material may contain a binder to ensure its moldability and strength.

The binder is preferably selected from materials that are not sublimate or vaporize at the evaporation temperature applied. Specific examples thereof include epoxy resins, urethane resins and acryl resins.

The method for producing the light emitting layer-forming solid material is not particularly limited and may be appropriately selected depending on the intended purpose. In one exemplary method, the host material, the light-emitting material and the thermally conductive material having no sublimation property are added at a desired ratio to and thoroughly stirred with a mixer until a homogeneous mixture is obtained. The resultant mixture is completely dehydrated with heating at 60° C. to 80° C. in vacuum, and then is charged into a compression molding apparatus in an inert gas atmosphere or in vacuum, followed by hot-press molding at a pressure of 50 $kg/cm^2$ to 200 $kg/cm^2$ and a heating temperature of 100° C. to 250° C.

The composition of an evaporation film formed from the light emitting layer-forming solid material preferably changes depending on the heating temperature of the evaporation source. The composition of the evaporation film is desirably adjusted by desirably controlling the temperature of the evaporation source. Specifically, the heating temperature of the evaporation source is preferably 100° C. to 400° C.

(Method for Producing Organic Electroluminescent Device)

A method of the present invention for producing an organic electroluminescent device (organic electroluminescent device-producing method) includes at least a light emitting layer-forming step; and, if necessary, further includes other steps.

<Light Emitting Layer-Forming Step>

The light emitting layer-forming step is a step of evaporating the light emitting layer-forming solid material of the present invention so as to form a light emitting layer.

The vacuum evaporation conditions, including evaporation rate, evaporation pressure, heating temperature of an evaporation source, type of an evaporation source container, substrate temperature, evaporation source-substrate interdistance, angle formed between substrate surface and straight line connecting evaporation source with substrate surface and degree of vacuum upon evaporation, are not particularly limited and may be appropriately selected depending on the intended purpose.

Suitably employed evaporation source containers are, for example, an alumina crucible, a quartz cell and a metal board made of Mo, W, etc.

The heating temperature of the evaporation source may be appropriately selected depending on the material for the light emitting layer, but preferably 100° C. to 400° C. The heating temperature of the evaporation source refers to a temperature that is the same as the temperature of the evaporation cell.

The substrate temperature is preferably −50° C. to 100° C.

The evaporation source-substrate interdistance is preferably 5 cm to 70 cm.

The angle formed between the perpendicular line to the substrate surface and the straight line connecting the evaporation source with the substrate surface is preferably 0° to 40°.

The degree of vacuum upon evaporation is preferably $1\times10^{-5}$ Pa to $5\times10^{-4}$ Pa.

The evaporation rate is preferably 0.01 nm/s to 10 nm/s, more preferably 0.1 nm/s to 1 nm/s. When two or more types of the light emitting layer-forming solid material are co-evaporated at different evaporation rates, the evaporation rate is the total evaporation rate of these evaporation rates.

At the light emitting layer-forming step, in order to improve thermal contact between the evaporation cell and the light emitting layer-forming solid material, a highly thermally conductive, non-sublimation material is optionally charged into the evaporation cell together with the solid material.

The thermally conductive material is not particularly limited and may be appropriately selected depending on the intended purpose. Suitably employed examples thereof include particles of thermally conductive carbides, nitrides and metals such as SiC, diamond, tungsten, Cu, graphite, BN, AlN, WC and TiC.

Notably, the layers constituting the organic electroluminescent device other than the light emitting layer (e.g., a hole injection layer and electron injection layer) can be produced using a solid material.

(Organic Electroluminescent Device)

An organic electroluminescent device of the present invention is produced by the organic electroluminescent device-producing method of the present invention. The organic electroluminescent device includes an anode, a cathode and at least a light emitting layer therebetween. It preferably contains an electron transport layer, an electron injection layer, a hole injection layer, a hole transport layer, a hole blocking layer and an electron blocking layer; and, if necessary, may further include other components.

<Light Emitting Layer>

The light emitting layer is formed at the light emitting layer-forming step.

The thickness of the light emitting layer is not particularly limited and may be appropriately selected depending on the intended purpose. The thickness thereof is preferably 5 nm to 100 nm, more preferably 20 nm to 40 nm.

<Electron Injection Layer and Electron Transport Layer>

The electron injection layer or the electron transport layer is a layer having the function of receiving electrons from the cathode or from the cathode side and transporting the electrons to the anode side.

The electron transport layer contains the electron transporting host material, the electron-donating dopant and other materials.

The thickness of the electron injection layer or the electron transport layer is not particularly limited and may be appropriately selected depending on the intended purpose. The thickness thereof is preferably 500 nm or smaller from the viewpoint of reducing drive voltage.

The thickness of the electron transport layer is preferably 1 nm to 500 nm, more preferably 5 nm to 200 nm, further preferably 10 nm to 100 nm.

The thickness of the electron injection layer is preferably 0.1 nm to 200 nm, more preferably 0.2 nm to 100 nm, further preferably 0.5 nm to 50 nm.

The electron injection layer or the electron transport layer may have a single-layered structure made of one or more materials, or a multi-layered structure made of a plurality of layers which are identical or different in composition.

<Hole Injection Layer and Hole Transport Layer>

The hole injection layer or the hole transport layer is a layer having the function of receiving holes from the anode or from the anode side and transporting the holes to the cathode side. The hole injection layer or the hole transport layer may have a single-layered structure or a multi-layered structure made of a plurality of layers which are identical or different in composition.

The hole injection material or the hole transport material used in these layers may be any of a low-molecular-weight compound and a high-molecular-weight compound.

The hole injection material or the hole transport material is not particularly limited and may be appropriately selected depending on the intended purpose. Examples thereof include pyrrole derivatives, carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidine compounds, phthalocyanine compounds, porphyrin compounds, thiophene derivatives, organosilane derivatives and carbon. These may be use alone or in combination.

The hole injection layer or the hole transport layer may contain an electron-accepting dopant.

The electron-accepting dopant may be, for example, an inorganic or organic compound, so long as it has electron accepting property and the function of oxidizing an organic compound.

The inorganic compound is not particularly limited and may be appropriately selected depending on the intended purpose. Examples thereof include metal halides (e.g., ferric chloride, aluminum chloride, gallium chloride, indium chloride and antimony pentachloride) and metal oxides (e.g., vanadium pentaoxide and molybdenum trioxide).

The organic compound is not particularly limited and may be appropriately selected depending on the intended purpose. Examples thereof include compounds having a substituent such as a nitro group, a halogen, a cyano group and a trifluoromethyl group; quinone compounds; acid anhydride compounds; and fullerenes. These electron-accepting dopants may be used alone or in combination.

The amount of the electron-accepting dopant used varies depending on the type of the material. The amount thereof is preferably 0.01% by mass to 50% by mass, more preferably 0.05% by mass to 30% by mass, particularly preferably 0.1% by mass to 30% by mass, relative to the hole transport material or the hole injection material.

The hole injection layer or the hole transport layer is not particularly limited and can be formed by a known method. Specifically, suitably employable methods include a dry film forming method such as a sputtering method or an evaporation method, a wet coating method, a transfer method, a printing method and an inkjet method.

The thickness of the hole injection layer or the hole transport layer is preferably 1 nm to 500 nm, more preferably 5 nm to 250 nm, further preferably 10 nm to 200 nm.

<Hole Blocking Layer and Electron Blocking Layer>

The hole blocking layer is a layer having the function of preventing the holes, which have been transported from the anode side to the light emitting layer, from passing toward the cathode side, and is generally provided as an organic compound layer adjacent to the light emitting layer on the cathode side.

The electron blocking layer is a layer having the function of preventing the electrons, which have been transported from the cathode side to the light emitting layer, from passing toward the anode side, and is generally provided as an organic compound layer adjacent to the light emitting layer on the anode side.

The compound for the hole blocking layer is not particularly limited and may be appropriately selected depending on the intended purpose. Examples thereof include aluminum complexes (e.g., BAlq), triazole derivatives and phenanthroline derivatives (e.g., BCP).

Examples of the compound employable for forming the electron blocking layer include the above-described hole transport materials.

The electron blocking layer or the hole blocking layer is not particularly limited and can be formed by a known method. Specifically, suitably employable methods include a dry film forming method such as a sputtering method or an evaporation method, a wet coating method, a transfer method, a printing method and an inkjet method.

The thickness of the hole blocking layer or the electron blocking layer is preferably 1 nm to 200 nm, more preferably 1 nm to 50 nm, further preferably 3 nm to 10 nm. Also, the hole blocking layer or the electron blocking layer may have a single-layered structure made of one or more materials, or a multi-layered structure made of a plurality of layers which are identical or different in composition.

<Electrode>

The organic electroluminescence device of the present invention includes pair of electrodes; i.e., an anode and a cathode. In terms of the function of the organic electroluminescence device, at least one of the anode and the cathode is preferably transparent. In general, the anode may be any material, so long as it has the function of serving as an electrode which supplies holes to the organic compound layer.

The shape, structure, size, etc. thereof are not particularly limited and may be appropriately selected from known electrode materials depending on the intended application/purpose of the organic electroluminescence device.

Preferred examples of the material for the electrodes include metals, alloys, metal oxides, conductive compounds and mixtures thereof.

—Anode—

The material for the anode is, for example, conductive metal oxides such as tin oxides doped with, for example, antimony and fluorine (ATO and FTO), tin oxide, zinc oxide, indium oxide, indium tin oxide (ITO) and indium zinc oxide (IZO); metals such as gold, silver, chromium and nickel; mixtures or laminates of these metals and the conductive metal oxides; inorganic conductive materials such as copper iodide and copper sulfide; organic conductive materials such as polyaniline, polythiophene and polypyrrole; and laminates of these materials and ITO. Among them, conductive metal oxides are preferred. In particular, ITO is preferred from the viewpoints of productivity, high conductivity, transparency, etc.

—Cathode—

The material for the cathode is, for example, alkali metals (e.g., Li, Na, K and Cs), alkaline earth metals (e.g., Mg and Ca), gold, silver, lead, aluminum, sodium-potassium alloys, lithium-aluminum alloys, magnesium-silver alloys and rare earth metals (e.g., indium and ytterbium). These may be used alone, but it is preferred that two or more of them are used in combination from the viewpoint of satisfying both stability and electron-injection property.

Among them, as the materials for forming the cathode, alkali metals or alkaline earth metals are preferred in terms of excellent electron-injection property, and materials containing aluminum as a major component are preferred in terms of excellent storage stability.

The term "material containing aluminum as a major component" refers to a material composed of aluminum alone; alloys containing aluminum and 0.01% by mass to 10% by mass of an alkali or alkaline earth metal; or the mixtures thereof (e.g., lithium-aluminum alloys and magnesium-aluminum alloys).

The method for forming the electrodes is not particularly limited and may be a known method. Examples thereof include wet methods such as printing methods and coating methods; physical methods such as vacuum deposition methods, sputtering methods and ion plating methods; and chemical methods such as CVD and plasma CVD methods. The electrodes can be formed on a substrate by a method appropriately selected from the above methods in consideration of their suitability to the material for the electrodes. For example, when ITO is used as the material for the anode, the anode may be formed in accordance with a DC or high-frequency sputtering method, a vacuum deposition method, or an ion plating method. For example, when a metal (or metals) is (are) selected as the material (or materials) for the cathode, one or more of them may be applied simultaneously or sequentially by, for example, a sputtering method.

Patterning for forming the electrodes may be performed by a chemical etching method such as photolithography; a physical etching method such as etching by laser; a method of vacuum deposition or sputtering using a mask; a lift-off method; or a printing method.

<Substrate>

The organic electroluminescence device of the present invention is preferably formed on a substrate, may be formed so that a substrate comes into direct contact with the electrodes, or may be formed on a substrate by the mediation of an intermediate layer.

The material for the substrate is not particularly limited and may be appropriately selected depending on the intended purpose. Examples thereof include inorganic materials such as yttria-stabilized zirconia (YSZ) and glass (alkali-free glass and soda-lime glass); and organic materials such as polyesters (e.g., polyethylene terephthalate, polybutylene phthalate and polyethylene naphthalate), polystyrene, polycarbonate, polyether sulfone, polyarylate, polyimide, polycycloolefin, norbornene resins and poly(chlorotrifluoroethylene).

The shape, structure, size, etc. of the substrate are not particularly limited and may be appropriately selected depending on, for example, the intended application/purpose of the light-emitting device. In general, the substrate is preferably a sheet. The substrate may have a single- or multi-layered structure, and may be a single member or a combination of two or more members. The substrate may be opaque, colorless transparent, or colored transparent.

The substrate may be provided with a moisture permeation-preventing layer (gas barrier layer) on the front or back surface thereof.

The moisture permeation-preventing layer (gas barrier layer) is preferably made from an inorganic compound such as silicon nitride and silicon oxide.

The moisture permeation-preventing layer (gas barrier layer) may be formed through, for example, high-frequency sputtering.

—Other Components—

The other components are not particularly limited and may be appropriately selected depending on the intended purpose. Examples thereof include a protective layer, a sealing container, a resin seal layer and a sealing adhesive.

The type of the protective layer, the sealing container, the resin seal layer or the sealing adhesive is not particularly limited and may be appropriately selected depending on the intended purpose. The description of JP-A No. 2009-152572 and other literatures can be applied thereto.

FIG. 1 is a schematic view of one exemplary layer structure of the organic electroluminescence device of the present invention. An organic electroluminescence device 10 has a layer structure in which a glass substrate 1 and an anode 2 (e.g., an ITO electrode), a hole injection layer 3, a hole transport layer 4, a light emitting layer 5, a first electron transport layer 6, a second electron transport is layer 7, an electron injection layer (not illustrated), a cathode 8 (e.g., an Al—Li electrode) disposed on the glass substrate in this order. Notably, the anode 2 (e.g., the ITO electrode) and the cathode 8 (e.g., the Al—Li electrode) are connected together via a power source.

—Driving—

The organic electroluminescence device can emit light when a DC voltage (which, if necessary, contains AC components) (generally 2 volts to 15 volts) or a DC is applied to between the anode and the cathode.

The organic electroluminescence device of the present invention can be applied to an active matrix using a thin film transistor (TFT). An active layer of the thin film transistor may be made from, for example, amorphous silicon, high-temperature polysilicon, low-temperature polysilicon, microcrystalline silicon, oxide semiconductor, organic semiconductor and carbon nanotube.

The thin film transistor used for the organic electroluminescence device of the present invention may be those described in, for example, International Publication No. WO2005/088726, JP-A No. 2006-165529 and U.S. Pat. Application Publication No. 2008/0237598.

The organic electroluminescence device of the present invention is not particularly limited. In the organic electroluminescence device, the light-extraction efficiency can be further improved by various known methods. It is possible to increase the light-extraction efficiency to improve the external quantum efficiency, for example, by processing the surface shape of the substrate (for example, by forming a fine concavo-convex pattern), by controlling the refractive index of the substrate, the ITO layer and/or the organic layer, or by controlling the thickness of the substrate, the ITO layer and/or the organic layer.

The manner in which light is extracted from the organic electroluminescence device of the present invention may be top-emission or bottom-emission.

The organic electroluminescence device may have a resonator structure. For example, in a first embodiment, on a transparent substrate are stacked a multi-layered film mirror composed of a plurality of laminated films having different refractive indices, a transparent or semi-transparent electrode, a light emitting layer and a metal electrode. The light generated in the light emitting layer is repeatedly reflected between the multi-layered film mirror and the metal electrode (which serve as reflection plates); i.e., is resonated.

In a second embodiment, a transparent or semi-transparent electrode and a metal electrode are stacked on a transparent substrate. In this structure, the light generated in the light emitting layer is repeatedly reflected between the transparent or semi-transparent electrode and the metal electrode (which serve as reflection plates); i.e., is resonated.

For forming the resonance structure, an optical path length determined based on the effective refractive index of two reflection plates, and on the refractive index and the thickness of each of the layers between the reflection plates is adjusted to be an optimal value for obtaining a desired resonance wavelength.

The calculation formula applied in the case of the first embodiment is described in JP-A No. 09-180883.

The calculation formula in the case of the second embodiment is described in JP-A No. 2004-127795.

—Application—

The application of the organic electroluminescence device of the present invention is not particularly limited and may be appropriately selected depending on the intended purpose. The organic electroluminescence device can be suitably used in, for example, display devices, displays, backlights, electrophotography, illuminating light sources, recording light sources, exposing light sources, reading light sources, markers, interior accessories and optical communication.

As a method for forming a full color-type display, there are known, for example, as described in "Monthly Display," September 2000, pp. 33 to 37, a tricolor light emission method by arranging, on a substrate, organic electroluminescence devices corresponding to three primary colors (blue color (B), green color (G) and red color (R)); a white color method by separating white light emitted from an organic electroluminescence device for white color emission into three primary colors through a color filter; and a color conversion method by converting a blue light emitted from an organic electroluminescence device for blue light emission into red color (R) and green color (G) through a fluorescent dye layer.

EXAMPLES

The present invention will next be described by way of Examples, which should not be construed as limiting the present invention thereto.

Example 1-1

Powder of compound 1 (host material) having the following Structural Formula and powder of compound 2 (phosphorescent light-emitting material) having the following Structural Formula were thoroughly mixed together at a ratio by mass of 30:70 (compound 1 compound 2). The resultant mixture was pressure-molded in vacuum while heated to 150° C., to thereby produce a light emitting layer-forming solid material as a pellet of 1 g.

Compound 1

Compound 2

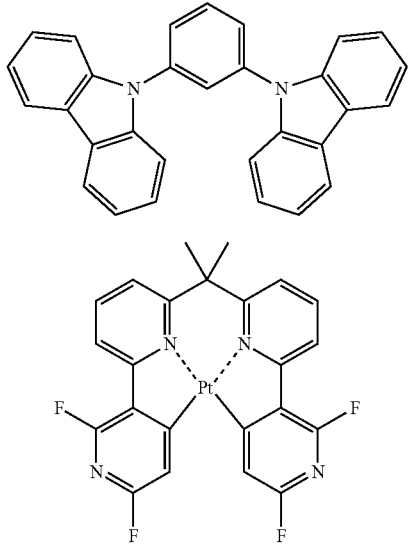

Compound 2 is a phosphorescent light-emitting material that emits white light by itself, that emits light at an emission peak of 468 nm, and that exhibits a broad association emission at a peak of around 625 nm, when its concentration (dopant) is increased.

Next, the light emitting layer-forming solid material produced in Example 1-1 was used to produce an organic electroluminescent device as follows.

—Production of Organic Electroluminescent Device—

A glass substrate (thickness: 0.5 mm, 2.5 cm×2.5 cm) was placed in a washing container, where the glass substrate was ultrasonically washed with a neutral detergent and then ultrasonically washed in pure water, followed by thermal treatment at 120° C. for 120 min. Thereafter, the thus-treated glass substrate was UV-ozone treated for 30 min. The following layers were evaporated on this glass substrate by a vacuum evaporation method. Notably, in Examples and Comparative Examples, unless otherwise specified, the evaporation rate was 0.2 nm/sec. The evaporation rate was measured with a quartz crystal unit. Also, the layer thicknesses given below were measured with a quartz crystal unit.

First, ITO (Indium Tin Oxide) was evaporated on the glass substrate by a vacuum evaporation method so as to form an anode having a thickness of 100 nm.

Next, 4,4',4"-tris(N,N-(2-naphthyl)-phenylamino)triphenylamine (2-TNATA) having the following Structural Formula doped with F4-TCNQ having the following Structural Formula at 1% by mass was evaporated on the anode (ITO) by a vacuum evaporation method so as to form a hole injection layer having a thickness of 45 nm.

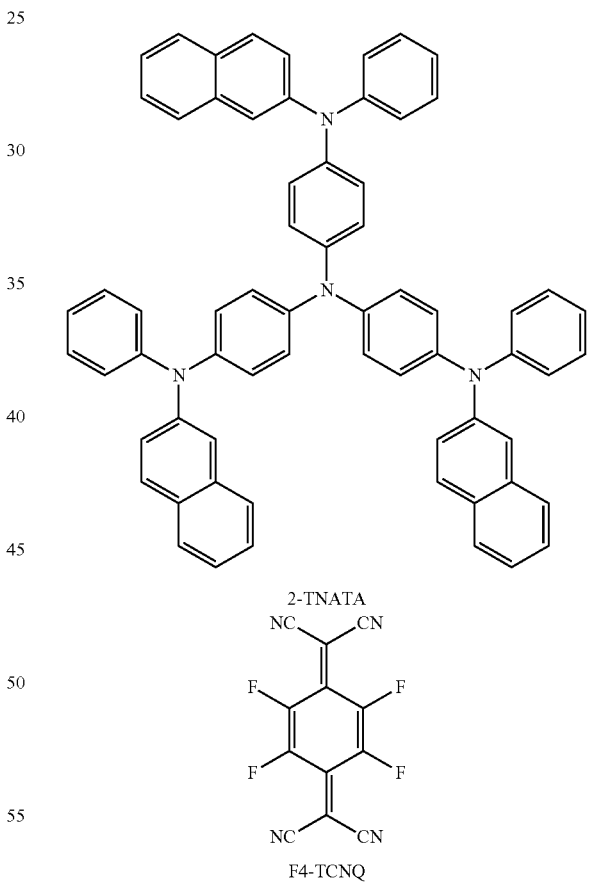

Next, α-NPD (bis[N-(1-naphthyl)-N-phenyl]benzidine) was evaporated on the hole injection layer by a vacuum evaporation method so as to form a hole transport layer having a thickness of 7 nm.

Next, compound 7 having the following Structural Formula was evaporated in vacuum on the hole transport layer so as to form a second hole transport layer having a thickness of 3 nm.

Compound 7

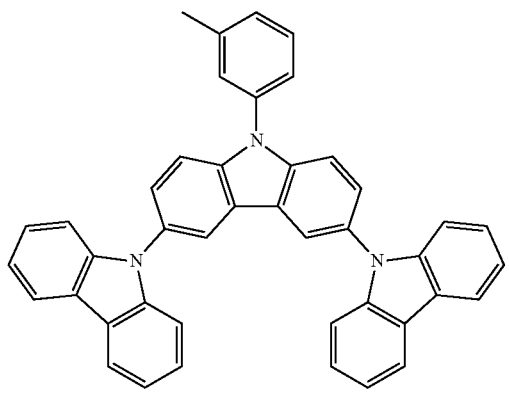

Next, the solid material produced in Example 1-1 was charged in an evaporation cell and then evaporated in vacuum on the second hole transport layer, to thereby form a light emitting layer having a thickness of 30 nm.

Notably, the heating temperature of the evaporation source (evaporation cell temperature) was controlled to be 270° C. upon formation of the light emitting layer through evaporation in vacuum.

The composition by mass of the light emitting layer at this stage was measured by analyzing an evaporation film produced under the same conditions through high-performance liquid chromatography (HPLC) (LC-2010HT, product of Shimadzu Corporation). As a result, the light emitting layer was identified to have a ratio by mass (compound 1:compound 2) of 60:40.

The evaporation conditions for the light emitting layer are as follows.
Evaporation apparatus: product of ALS Co., E-200
Evaporation source container: alumina crucible (height: 10 mm, diameter: 10 mm)
Substrate temperature: 30° C.
Heating temperature of evaporation source (evaporation cell temperature): 270° C.
Evaporation source-substrate interdistance: 40 cm
Angle formed between the perpendicular line to the substrate surface and the straight line connecting the evaporation source with the substrate surface: 20° to 25°
Degree of vacuum during evaporation: $1 \times 10^{-5}$ Pa to $3 \times 10^{-5}$ Pa
Evaporation rate: 0.2 nm/s Next, BAlq (bis-(2-methyl-8-quinolinolato)-4-(phenyl-phenolate)-aluminum(III)) having the following Structural Formula was evaporated in vacuum on the light-emitting layer so as to form an electron transport layer having a thickness of 30 nm.

BAlq

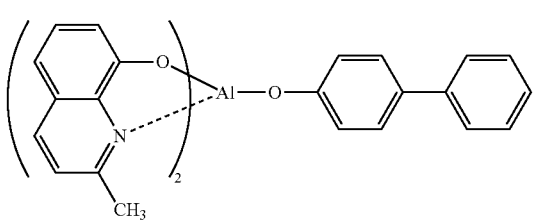

Next, LiF was evaporated in vacuum on the electron transport layer so as to form an electron injection layer having a thickness of 0.1 nm.

Next, a patterned mask (with which the formed emission regions were each 2 mm×2 mm) was placed on the electron injection layer, followed by vacuum evaporation of metal aluminum, to thereby form a cathode having a thickness of 70 nm.

The thus-obtained laminate was placed in a glove box which had been purged with nitrogen gas, and then was sealed in a stainless steel sealing can using a UV-ray curable adhesive (XNR5516HV, product of Nagase-CIBA Ltd.). Through the above procedure, an organic electroluminescent device of Example 1-1 was produced.

The layer structure of the organic electroluminescent device of Example 1-1 is as follows. The values in parentheses are the thicknesses of the layers. <ITO (100 nm)/2-TNATA+1% by mass F4-TCNQ (120 nm)/α-NPD (7 nm)/compound 7 (3 nm)/light emitting layer (30 nm)/BAlq (30 nm)/LiF (0.1 nm)/Al (70 nm)>

When the light emitting layer-forming solid material of Example 1-1 is used, the number of evaporation sources required is one although two evaporation sources have conventionally been required, and also cumbersome co-evaporation can be avoided, which is advantageous.

Example 1-2

The procedure of Example 1-1 was repeated, except that the evaporation cell temperature upon evaporation for the light emitting layer was changed from 270° C. to 280° C., to thereby produce an organic electroluminescent device of Example 1-2.

In the same manner as in Example 1-1, the composition by mass of the light emitting layer at this stage was measured by analyzing an evaporation film produced under the same conditions. As a result, the light emitting layer was identified to have a ratio by mass (compound 1 compound 2) of 50:50.

When the light emitting layer-forming solid material of Example 1-2 is used, the number of evaporation sources required is one although two evaporation sources have conventionally been required, and also cumbersome co-evaporation can be avoided, which is advantageous.

Example 2-1

Powder of compound 3 having the following Structural Formula (host material) and powders of the three light-emitting materials; i.e., compound 4 having the following Structural Formula (blue phosphorescent light-emitting material), compound 5 having the following Structural Formula (green phosphorescent light-emitting material) and compound 6 having the following Structural Formula (red phosphorescent light-emitting material) were thoroughly mixed together at a ratio by mass of 86.5:12.0:1.1:0.4 (compound 3:compound 4:compound 5:compound 6). The resultant mixture was pressure-molded in vacuum while heated to 200° C., to thereby produce a light emitting layer-forming solid material as a pellet of 1 g:

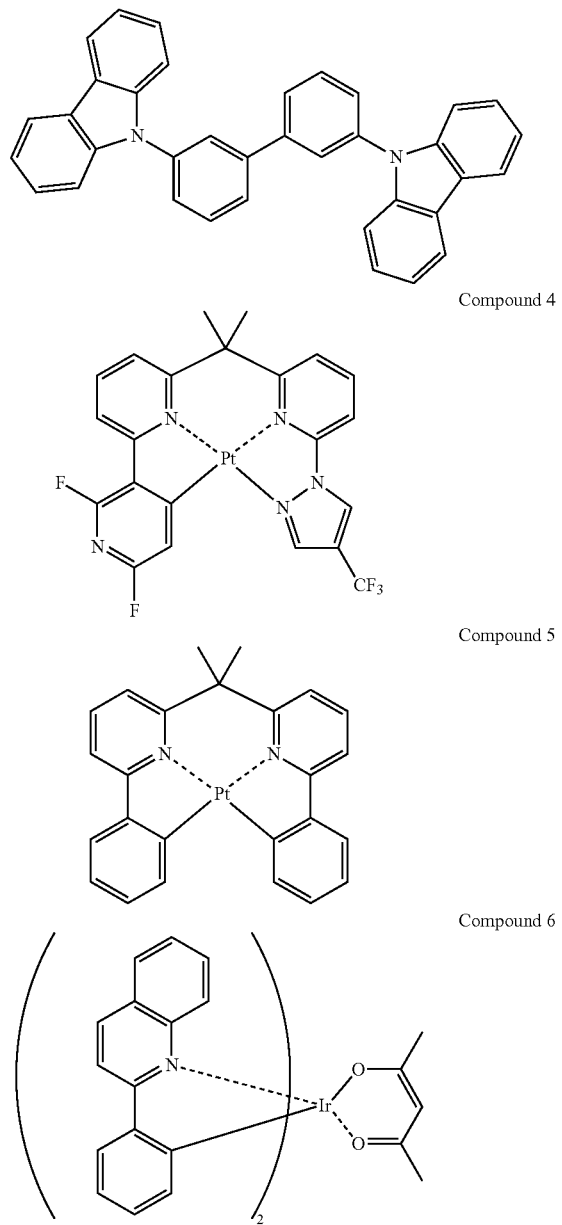

Compound 3

Compound 4

Compound 5

Compound 6

Next, the light emitting layer-forming solid material produced in Example 2-1 was used in the same manner as in Example 1-1, to thereby produce an organic electroluminescent device.

The evaporation cell temperature was controlled to be 270° C. upon formation of the light emitting layer through evaporation in vacuum. In the same manner as in Example 1-1, the composition by mass of the light emitting layer at this stage was measured by analyzing an evaporation film produced under the same conditions. As a result, the light emitting layer was identified to have a ratio by mass (compound 3:compound 4:compound 5:compound 6) of 85.0:13.5:1.0:0.5.

The layer structure of the organic electroluminescent device of Example 2-1 is as follows. The values in parentheses are the thicknesses of the layers. <ITO (100 nm)/2-TNATA+1% by mass F4-TCNQ (120 nm)/α-NPD (7 nm)/compound 7 (3 nm)/light emitting layer (30 nm)/BAlq (30 nm)/LiF (0.1 nm)/Al (70 nm)>

When the light emitting layer-forming solid material of Example 2-1 is used, the number of evaporation sources required is one although four evaporation sources have conventionally been required, and also cumbersome co-evaporation can be avoided, which is advantageous.

Example 2-2

The procedure of Example 2-1 was repeated, except that the evaporation cell temperature upon evaporation for the light emitting layer was changed from 270° C. to 280° C., to thereby produce an organic electroluminescent device of Example 2-2.

In the same manner as in Example 1-1, the composition by mass Of the light emitting layer at this stage was measured by analyzing an evaporation film produced under the same conditions. As a result, the light emitting layer was identified to have a ratio by mass (compound 3:compound 4:compound 5:compound 6) of 84.5:14.0:0.9:0.6.

When the light emitting layer-forming solid material of Example 2-2 is used, the number of evaporation sources required is one although four evaporation sources have conventionally been required, and also cumbersome co-evaporation can be avoided, which is advantageous.

Example 3-1

The procedure of Example 2-1 was repeated, except that SiC powder (highly thermally conductive material having no sublimation property) was additionally used as a light emitting layer-forming material and mixed together with compounds 3 to 6 at a ratio by mass of compound 3:compound 4:compound 5:compound 6: SiC of 42.5:6.7:0.5:0.3:50.0, followed by pressure-molding in vacuum with heating to 200° C., to thereby produce a light emitting layer-forming solid material as a pellet of 2 g.

Next, the light emitting layer-forming solid material produced in Example 3-1 was used in the same manner as in Example 1-1, to thereby produce an organic electroluminescent device. The evaporation cell temperature upon vacuum evaporation for the light emitting layer was controlled to 265° C. The composition by mass of the light emitting layer at this stage was measured by analyzing an evaporation film produced under the same conditions as follows. Specifically, the organic materials of the evaporation film were analyzed in the same manner as in Example 1-1 while the inorganic material thereof was analyzed with an ICP mass spectrometer (ICPM-8500, product of Shimadzu Corporation). As a result, the light emitting layer was identified to have a ratio by mass (compound 3:compound 4:compound 5:compound 6:SiC) of 85.0:13.5:1.0:0.5:0.0 (not detected).

When the light emitting layer-forming solid material of Example 3-1 is used, the number of evaporation sources required is one although four evaporation sources have conventionally been required, and also cumbersome co-evaporation can be avoided, which is advantageous.

Example 3-2

The procedure of Example 3-1 was repeated, except that the evaporation cell temperature upon evaporation for the light emitting layer was changed from 265° C. to 275° C., to thereby produce an organic electroluminescent device of Example 3-2. In the same manner as in Example 3-1, the composition by mass of the light emitting layer at this stage was measured by analyzing an evaporation film produced under the same conditions. As a result, the light emitting layer was identified to have a ratio by mass (compound 3:compound 4:compound 5:compound 6:SiC) of 84.9:13.6:1.0:0.5: 0.0 (not detected).

When the light emitting layer-forming solid material of Example 3-2 is used, the number of evaporation sources required is one although four evaporation sources have conventionally been required, and also cumbersome co-evaporation can be avoided, which is advantageous.

Example 4-1

Compound 8 having the following Structural Formula (host material) and the following light-emitting materials; i.e., compound 9 (blue fluorescent light-emitting material), compound 10 (green fluorescent light-emitting material) and compound 11 (red fluorescent light-emitting material) were thoroughly mixed together at a ratio of 94.5:4.7:0.6:0.2 (compound 8:compound 9:compound 10:compound 11), followed by pressure-molding in vacuum with heating to 200° C., to thereby produce a light emitting layer-forming solid material as a pellet of 1 g.

Compound 8

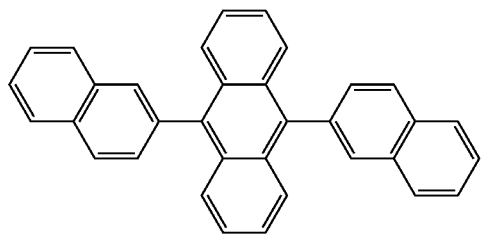

Compound 9

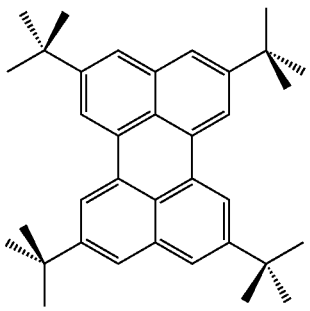

Compound 10

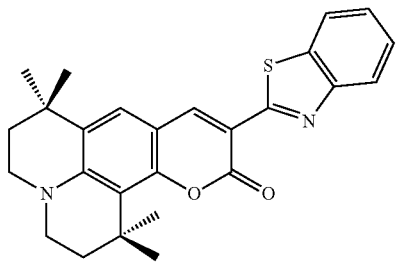

-continued

Compound 11

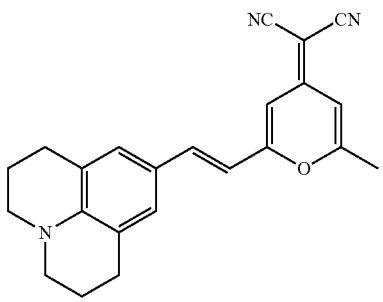

Next, the light emitting layer-forming solid material produced in Example 4-1 was used in the same manner as in Example 1-1, to thereby produce an organic electroluminescent device. The evaporation cell temperature upon vacuum evaporation for the light emitting layer was controlled to be 230° C. In the same manner as in Example 1-1, the composition by mass of the light emitting layer at this stage was measured by analyzing an evaporation film produced under the same conditions. As a result, the light emitting layer was identified to have a ratio by mass (compound 8:compound 9:compound 10:compound 11) of 94.3:5.0:0.5:0.2.

The layer structure of the organic electroluminescent device of Example 4-1 is as follows. The values in parentheses are the thicknesses of the layers. <ITO (100 nm)/2-TNATA+1% by mass F4-TCNQ (120 nm)/α-NPD (7 nm)/compound 7 (3 nm)/light emitting layer (30 nm)/BAlq (30 nm)/LiF (0.1 nm)/Al (70 nm)>

When the light emitting layer-forming solid material of Example 4-1 is used, the number of evaporation sources required is one although four evaporation sources have conventionally been required, and also cumbersome co-evaporation can be avoided, which is advantageous.

Example 4-2

The procedure of Example 4-1 was repeated, except that the evaporation cell temperature upon evaporation for the light emitting layer was changed from 230° C. to 240° C., to thereby produce an organic electroluminescent device of Example 4-2. In the same manner as in Example 1-1, the composition by mass of the light emitting layer at this stage was measured by analyzing an evaporation film produced under the same conditions. As a result, the light emitting layer was identified to have a ratio by mass (compound 8:compound 9:compound 10:compound 11) of 94.1:5.3:0.4:0.2.

When the light emitting layer-forming solid material of Example 4-2 is used, the number of evaporation sources required is one although four evaporation sources have conventionally been required, and also cumbersome co-evaporation can be avoided, which is advantageous.

Notably, in this Example, a hole injection layer consisting of 2-TNATA (99% by mass) and dopant F4-TCNQ (1% by mass) was formed by a co-evaporation method. The hoel injection layer may also be formed from a pellet of 2-TNATA and F4-TCNQ mixed together. As a result, the number of evaporation sources required is one although two evaporation sources have conventionally been required, and also cumbersome co-evaporation can be avoided, which is advantageous.

<Sublimation Temperature of Compound>

The sublimation temperature of each of compounds 1 to 11 used for forming the light emitting layer-forming solid materials refers to a temperature at which the mass of each compound is decreased by 10% by mass when measured in vacuum through TG-DTA (DTG-60, product of Shimadzu Corporation) under the following conditions: temperature increasing rate: 2° C./min and degree of vacuum upon is initiation of the measurement: $10^{-2}$ Pa. The results are shown in Table 1.

TABLE 1

|  | Compound | Sublimation temperature (° C.) |
|---|---|---|
| Host material | 1 | 200 |
| Phosphorescent light-emitting material | 2 | 255 |
| Host material | 3 | 249 |
| Phosphorescent light-emitting material | 4 | 245 |
| Phosphorescent light-emitting material | 5 | 251 |
| Phosphorescent light-emitting material | 6 | 243 |
| Host material | 8 | 218 |
| Fluorescent light-emitting material | 9 | 200 |
| Fluorescent light-emitting material | 10 | 220 |
| Fluorescent light-emitting material | 11 | 211 |

As shown in Table 1, since the sublimation temperatures of compounds 1 and 2 used in Examples 1-1 and 1-2 are greatly different from each other, the compositional ratios of the evaporation films could be greatly changed (adjusted) by changing the evaporation cell temperature.

In Examples 4-1 and 4-2, since the differences in sublimation temperature between compounds 8, 9, 10 and 11 are within 20° C. as an absolute value, the compositional ratios of the evaporation films could not be greatly changed by changing the evaporation cell temperature.

In Examples 2-1, 2-2, 3-1 and 3-2, since the differences in sublimation temperature between compounds 3, 4, 5 and 6 are within 10° C. as an absolute value, the compositional ratios of the evaporation films were changed to a less extent than in Examples 4-1 and 4-2 even by changing the evaporation cell temperature.

In conclusion, depending on the intended purpose, by combining together materials whose sublimation temperatures are greatly or slightly different, the extent of a change in the compositional ratio by mass of the formed evaporation film could be controlled by changing the heating temperature of the evaporation source (evaporation cell temperature).

Evaluation

Examples 1-1 to 4-2

Ten organic electroluminescent devices were continuously produced under the conditions of each of Examples 1-1 to 4-2. The thus-produced 10 organic electroluminescent devices were evaluated as follows for external quantum efficiency, half service life, average value and deviation. The results are shown in Table 2.

Comparative Examples 1-1 to 4-2

In each of Comparative Examples 1-1 to 4-2, the procedure of the corresponding Example was repeated, except that the light emitting layer-forming solid material was changed to conventional powder materials, which were evaporated by a co-evaporation method under the conditions that an evaporation film having the same composition was obtained, to thereby produce 10 organic electroluminescent devices. The thus-produced 10 organic electroluminescent devices were evaluated as follows for external quantum efficiency, half service life, average value and deviation. The results are shown in Table 2.

<<External Quantum Efficiency>>

Using source measure unit model 2400 (product of product of Keithley Instruments Inc.), DC current of 10 mA/cm² was applied to each device for light emission. The brightness upon light emission was measured with a brightness meter BM-8 (product of TOPCON CORPORATION). The emission spectrum and emission wavelength were measured with a spectrum analyzer PMA-11 (product of Hamamatsu Photonics K.K.). On the basis of the obtained values, the external quantum efficiency was calculated by a brightness conversion method.

<<Half Service Life (Drive Durability)>>

A constant current of 10 mA/cm² was applied to each organic electroluminescent device, and the time required that the initial brightness was decreased by half was measured.

TABLE 2

|  | Evaporation cell temperature (° C.) | External quantum efficiency (%) 10 mA/cm² | Half service life (h) 10 mA/cm² |
|---|---|---|---|
| Comp. Ex. 1-1 | — | 12.0 ± 2.4 | 1200 ± 120 |
| Ex. 1-1 | 270 | 15.0 ± 1.6 | 1850 ± 80 |
| Comp. Ex. 1-2 | — | 10.2 ± 2.1 | 1050 ± 110 |
| Ex. 1-2 | 280 | 12.0 ± 1.1 | 1530 ± 70 |
| Comp. Ex. 2-1 | — | 10.1 ± 2.5 | 700 ± 170 |
| Ex. 2.1 | 270 | 12.9 ± 1.2 | 1400 ± 100 |
| Comp. Ex. 2-2 | — | 9.7 ± 2.6 | 670 ± 150 |
| Ex. 2-2 | 280 | 12.6 ± 1.3 | 1370 ± 90 |
| Comp. Ex. 3-1 | — | 10.1 ± 2.5 | 700 ± 170 |
| Ex. 3-1 | 265 | 14.1 ± 0.7 | 1700 ± 80 |
| Comp. Ex. 3-2 | — | 9.7 ± 2.6 | 670 ± 150 |
| Ex. 3-2 | 275 | 14.0 ± 0.6 | 1680 ± 80 |
| Comp. Ex. 4-1 | — | 3.7 ± 0.5 | 2200 ± 500 |
| Ex. 4-1 | 230 | 4.2 ± 0.3 | 2450 ± 170 |
| Comp. Ex. 4-2 | — | 3.6 ± 0.6 | 2100 ± 450 |
| Ex. 4-2 | 240 | 4.0 ± 0.4 | 2300 ± 150 |

As shown in Table 2, in Example 3-1, the evaporation film having a compositional ratio similar to that in Example 2-1 could be formed at an evaporation cell temperature lower by 5° C. than in Example 2-1, since the thermally conductive material was additionally used. As a result, reduction of thermodecomposition of the materials could be attained and the drive durability (half service life) of the organic electroluminescent device could be improved.

As compared with the organic electroluminescent devices of Examples 4-1 and 4-2 in which the fluorescent light-emitting material was used, the organic electroluminescent devices of Examples 1-1, 1-2, 2-1, 2-2, 3-1 and 3-2, in which the phosphorescent light-emitting material was used, were found to exhibit higher improvement effect on drive voltage (half service life) than those of the corresponding Comparative Examples (which were produced through co-evaporation of the powder materials). That is, the improvement effect was about 1.1 times in use of the fluorescent light-emitting material, while the improvement effect was about 1.5 times to 2 times in use of the phosphorescent light-emitting material. As compared with Comparative Examples in which co-evaporation was performed, the deviations of the characteristics (emission efficiency and half service life) of the organic electroluminescent devices produced in Examples was decreased to about ⅔ to about ⅓.

Moreover, in Examples 3-1 and 3-2 in which the thermally conductive material was additionally used, the deviations of the characteristics were further decreased and also the characteristics (emission efficiency and half service life) were improved. This is likely because thermodecompostion of the materials during evaporation could be suppressed.

The organic electroluminescence device containing the light emitting layer produced from the light emitting layer-forming solid material of the present invention can be suitably used in, for example, display devices, displays, backlights, electrophotography, illuminating light sources, recording light sources, exposing light sources, reading light sources, markers, interior accessories and optical communication.

What is claimed is:

1. A light emitting layer-forming solid material, comprising:
    at least one host material, and
    at least one light-emitting material,
    wherein the light emitting layer-forming solid material has a pellet shape and is not in a powder form, wherein the light emitting layer-forming solid material is capable of forming a white light emitting layer having a single layer structure under evaporation conditions, wherein a difference between a sublimation temperature of the host material and a sublimation temperature of the light-emitting material is within 20° C. as an absolute value, and
    wherein the light emitting layer-forming solid material further comprises at least one thermally conductive material having no sublimation property, and thermal conductivity of the thermally conductive material is higher than that of the at least one host material and at least one light-emitting material contained in the light emitting layer-forming solid material, wherein said thermally conductive material having no sublimation property is SiC.

2. The light emitting layer-forming solid material according to claim 1, wherein the at least one light-emitting material is at least two light-emitting materials.

3. The light emitting layer-forming solid material according to claim 2, wherein the at least two light-emitting materials emit different lights.

4. The light emitting layer-forming solid material according to claim 1, wherein the at least one light-emitting material is a phosphorescent light-emitting material.

5. The light emitting layer-forming solid material according to claim 1, wherein a difference between a sublimation temperature of the host material and a sublimation temperature of the light-emitting material is within 10° C. as an absolute value.

6. The light emitting layer-forming solid material according to claim 1, wherein the light emitting layer-forming solid material is capable of forming an evaporation film when said light emitting layer-forming solid material is at evaporation conditions provided by an evaporation source, and a composition of the evaporation film varies as a heating temperature of the evaporation source is changed.

7. The light emitting layer-forming solid material according to claim 1, wherein the light emitting layer-forming solid material is capable of forming an evaporation film, wherein the light emitting layer-forming solid material has a composition which differs from a composition of said evaporation film.

8. A method for producing an organic electroluminescent device, comprising:
    evaporating a light emitting layer-forming solid material so as to form a light emitting layer, wherein the light emitting layer-forming solid material has a pellet shape and is not in a powder form,
    wherein the light emitting layer-forming solid material comprises at least one host material and at least one light-emitting material,
    wherein the light emitting layer is a white light emitting layer having a single layer structure, wherein a difference between a sublimation temperature of the host material and a sublimation temperature of the light-emitting material is within 20° C. as an absolute value, and
    wherein the light emitting layer-forming solid material further comprises at least one thermally conductive material having no sublimation property, and thermal conductivity of the thermally conductive material is higher than that of the at least one host material and at least one light-emitting material contained in the light emitting layer-forming solid material, wherein said thermally conductive material having no sublimation property is SiC.

9. An organic electroluminescent device obtained by a method comprising:
    evaporating a light emitting layer-forming solid material so as to form a light emitting layer, wherein the light emitting layer-forming solid material has a pellet shape and is not in a powder form,
    wherein the light emitting layer-forming solid material comprises at least one host material and at least one light-emitting material,
    wherein the light emitting layer is a white light emitting layer having a single layer structure, wherein a difference between a sublimation temperature of the host material and a sublimation temperature of the light-emitting material is within 20° C. as an absolute value, and
    wherein the light emitting layer-forming solid material further comprises at least one thermally conductive material having no sublimation property, and thermal conductivity of the thermally conductive material is higher than that of the at least one host material and at least one light-emitting material contained in the light emitting layer-forming solid material, wherein said thermally conductive material having no sublimation property is SiC.

* * * * *